(12) United States Patent
Funabiki et al.

(10) Patent No.: US 8,281,468 B2
(45) Date of Patent: Oct. 9, 2012

(54) METHOD OF MANUFACTURING PIEZOELECTRIC VIBRATORS

(75) Inventors: Yoichi Funabiki, Chiba (JP); Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/868,301

(22) Filed: Aug. 25, 2010

(65) Prior Publication Data

US 2011/0050044 A1 Mar. 3, 2011

(30) Foreign Application Priority Data

Aug. 25, 2009 (JP) ................................. 2009-194474

(51) Int. Cl.
*H04R 17/10* (2006.01)
*H05K 3/10* (2006.01)

(52) U.S. Cl. ....... 29/25.35; 29/852; 427/97.2; 427/97.7; 310/344; 174/262; 174/564

(58) Field of Classification Search ..................... 29/594, 29/25.35, 852; 427/92.7, 97.7, 97.2; 310/344; 174/261, 262, 559, 564, 565; 216/52
See application file for complete search history.

(56) References Cited

U.S. PATENT DOCUMENTS

| | | | | |
|---|---|---|---|---|
| 5,257,452 A | * | 11/1993 | Imai et al. | 29/852 X |
| 5,699,027 A | * | 12/1997 | Tsuji et al. | 310/344 X |
| 5,699,613 A | * | 12/1997 | Chong et al. | 29/852 |
| 6,627,823 B1 | * | 9/2003 | Taran et al. | 174/262 |
| 6,629,367 B2 | * | 10/2003 | Burdon et al. | 29/852 |
| 6,717,071 B2 | * | 4/2004 | Chang et al. | 174/281 X |
| 6,924,429 B2 | * | 8/2005 | Kasai et al. | 174/565 |
| 7,351,660 B2 | * | 4/2008 | Brewer et al. | 216/52 X |
| 2006/0115583 A1 | * | 6/2006 | Takenaka et al. | 427/97.7 |

FOREIGN PATENT DOCUMENTS

| | | | |
|---|---|---|---|
| JP | 06283951 A | * | 10/1994 |
| JP | 2002-124845 A | | 4/2002 |
| JP | 2006-279872 A | | 10/2006 |

* cited by examiner

*Primary Examiner* — A. Dexter Tugbang
(74) *Attorney, Agent, or Firm* — Brinks Hofer Gilson & Lione

(57) ABSTRACT

Providing a method for manufacturing a package capable of improving production efficiency. Providing a method for manufacturing a package including: a base board and a lid board which are bonded to each other; an accommodated article which is sealed in a cavity formed between the base board and the lid board; and a penetration electrode which is disposed in a penetration hole penetrating through the base board so as to electrically connect the accommodated article to the outside, the method including: a penetration hole forming step of forming a penetration hole for the penetration electrodes 30b, 30b in the base board; a penetration electrode alignment step of inserting a core portion 7 of a conductive rivet member 9 into the penetration hole of the base board; a glass frit filling step of applying a paste-like glass frit 6a onto the other surface of the base board and filling the glass frit into the penetration hole; and a baking step of baking and curing the glass frit, wherein the glass frit filling step involves forming a glass frit filling portion 41 having a larger diameter than the penetration hole and filling the glass frit also into the glass frit filling portion.

10 Claims, 23 Drawing Sheets

METHOD OF MANUFACTURING PIEZOELECTRIC VIBRATORS

RELATED APPLICATIONS

This application claims priority under 35 U.S.C. §119 to Japanese Patent Application No. 2009-194474 filed on Aug. 25, 2009, the entire content of which is hereby incorporated by reference.

BACKGROUND OF THE INVENTION

1. Field of the Invention

The present invention relates to a method for manufacturing a package in which an accommodated article is sealed in a cavity formed between two bonded boards, a method for manufacturing an SMD-type piezoelectric vibrator in which a piezoelectric vibrating reed is sealed as the accommodated article, and an oscillator, an electronic device, and a radio-controlled timepiece each having the piezoelectric vibrator.

2. Description of the Related Art

In the related art, a package in which a pair of boards is bonded together, and an accommodated article is sealed in a cavity formed between the boards is known. As one type of such a package, a piezoelectric vibrator utilizing quartz or the like is known which is used in a cellular phone and a portable information terminal as the time source, the timing source of a control signal, a reference signal source, and the like.

Although there are various piezoelectric vibrators of this type, an SMD-type piezoelectric vibrator is known as one example thereof.

As the SMD-type piezoelectric vibrator, a two-layered piezoelectric vibrator in which a base board and a lid board are directly bonded together, and a piezoelectric vibrating reed is accommodated in a cavity formed between both boards is known. The two-layered piezoelectric vibrator is suitably used in that it is excellent in achieving a thin profile. As an example of the two-layered piezoelectric vibrator, JP-A-2002-124845 and JP-A-2006-279872, for example, disclose a piezoelectric vibrator in which a piezoelectric vibrating reed and an outer electrode formed on a base board are electrically connected using a conductive member (penetration electrode) which is formed so as to penetrate through the base board.

As a method of forming the penetration electrode in a penetration hole formed in the base board of the piezoelectric vibrator, a method of filling conductive silver paste in the penetration hole and baking the silver paste, a method of disposing a conductive core material in the penetration hole so as to electrically connect both surfaces of the base board, filling a glass frit in other regions, and baking the glass frit, and the like are known.

However, when the penetration electrode is formed using the conductive core material and the glass frit, the volume of the glass frit will decrease during the drying and sintering steps. Therefore, in order to fill a desired amount of glass frit in the penetration hole, it is necessary to repeat the filling, drying, and sintering steps of the glass frit several times. Thus, there is a problem in that the manufacturing process takes a lot of labor and time, and thus the production efficiency decreases.

SUMMARY OF THE INVENTION

The present invention has been made in view of the foregoing, and an object of the present invention is to provide a method for manufacturing a package capable of improving production efficiency, a method for manufacturing a piezoelectric vibrator, and an oscillator, an electronic device, and a radio-controlled timepiece.

The present invention provides the following means in order to solve the problems.

According to an aspect of the present invention, there is provided a method for manufacturing a package including: a base board and a lid board which are bonded to each other; an accommodated article which is sealed in a cavity formed between the base board and the lid board; and a penetration electrode which is disposed in a penetration hole penetrating through the base board so as to electrically connect the accommodated article to the outside, the method including: a penetration hole forming step of forming a penetration hole for the penetration electrode in the base board; a penetration electrode alignment step of inserting a core portion of a conductive rivet member, which includes a planar base portion and the core portion extending in a direction perpendicular to a surface of the base portion, into the penetration hole of the base board, and bringing the base portion of the rivet member into contact with one surface of the base board; a glass frit filling step of applying a paste-like glass frit onto the other surface of the base board and filling the glass frit into the penetration hole; and a baking step of baking and curing the glass frit, wherein the glass frit filling step involves forming a glass frit filling portion having a larger diameter than the penetration hole and filling the glass frit also into the glass frit filling portion.

According to the package manufacturing method according to the above aspect of the present invention, since the glass frit filling portion having a larger diameter than the penetration hole is formed, it is possible to increase the amount of the glass frit that can be filled at a time. Therefore, although the volume of the glass frit decreases when the glass frit is baked later, the volume of the glass frit after the baking will be increased compared with the related art. That is, it is possible to decrease the number of times of filling (and baking) the glass frit in order to fill a desired amount of glass frit in the penetration hole, and thus the production efficiency of the package can be improved.

In the package manufacturing method according to another aspect of the present invention, the glass frit filling portion may be formed on the base board.

According to the package manufacturing method according to the above aspect of the present invention, for example, when the penetration hole is formed in the base board by press molding, simply by pressing a member having a shape corresponding to the penetration hole and the glass frit filling portion, it is possible to form the penetration hole and the glass frit filling portion on the base board. That is, it is possible to improve the production efficiency of the package with a simple configuration.

In the package manufacturing method according to the above aspect of the present invention, the glass frit filling portion is formed on a mask member which is provided to protect the base board when removing a redundant glass frit during the glass frit filling step.

According to the package manufacturing method according to the above aspect of the present invention, by forming a penetration hole having a larger diameter than the penetration hole of the base board in a mask member used during the glass frit filling step, it is possible to use the large-diameter penetration hole as the glass frit filling portion. That is, it is possible to improve the production efficiency of the package with a simple configuration.

According to another aspect of the present invention, there is provided a method for manufacturing a piezoelectric vibrator using a base board wafer and a lid board wafer, the method including: a cavity forming step of forming a cavity on the lid board wafer so as to accommodate a piezoelectric vibrating reed when both wafers are superimposed onto each other; a penetration electrode forming step of forming a penetration electrode on the base board wafer using a rivet member for the penetration electrode; a lead-out electrode forming step of forming a lead-out electrode on one surface of the base board wafer so as to be electrically connected to the penetration electrode; a mounting step of bonding the piezoelectric vibrating reed to the one surface of the base board wafer with the lead-out electrode interposed therebetween; a superimposition step of superimposing the base board wafer and the lid board wafer onto each other so as to accommodate the piezoelectric vibrating reed in the cavity; a bonding step of bonding the base board wafer and the lid board wafer to each other so as to seal the piezoelectric vibrating reed in the cavity; an outer electrode forming step of forming an outer electrode on the other surface of the base board wafer so as to be electrically connected to the penetration electrode; and a cutting step of cutting the two bonded wafers to obtain a plurality of fragmented piezoelectric vibrators, wherein the penetration electrode forming step includes: a penetration hole forming step of forming a penetration hole for the penetration electrode in the base board wafer; a penetration electrode alignment step of inserting a core portion of a conductive rivet member, which includes a planar base portion and the core portion extending in a direction perpendicular to a surface of the base portion, into the penetration hole of the base board wafer, and bringing the base portion of the rivet member into contact with one surface of the base board wafer; a glass frit filling step of applying a paste-like glass frit onto the other surface of the base board wafer and filling the glass frit into the penetration hole; and a baking step of baking the glass frit at a predetermined temperature so that the penetration hole, the glass frit, and the core portion of the rivet member are integrally fixed, and wherein the glass frit filling step involves forming a glass frit filling portion having a larger diameter than the penetration hole and filling the glass frit also into the glass fit filling portion.

According to the piezoelectric vibrator manufacturing method according to the above aspect of the present invention, since the glass frit filling portion having a larger diameter than the penetration hole is formed, it is possible to increase the amount of the glass frit that can be filled at a time. Therefore, although the volume of the glass frit decreases when the glass frit is baked later, the volume of the glass frit after the baking will be increased compared with the related art. That is, it is possible to decrease the number of times of filling (and baking) the glass frit in order to fill a desired amount of glass frit in the penetration hole, and thus the production efficiency of the piezoelectric vibrator can be improved.

In the piezoelectric vibrator manufacturing method according to another aspect of the present invention, the glass frit filling portion may be formed on the base board.

According to the piezoelectric vibrator manufacturing method according to the above aspect of the present invention, for example, when the penetration hole is formed in the base board wafer by press molding, simply by pressing a member having a shape corresponding to the penetration hole and the glass frit filling portion, it is possible to form the penetration hole and the glass frit filling portion on the base board wafer. That is, it is possible to improve the production efficiency of the piezoelectric vibrator with a simple configuration.

In the piezoelectric vibrator manufacturing method according to the above aspect of the present invention, the glass frit filling portion is formed on a mask member which is provided to protect the base board when removing a redundant glass frit during the glass frit filling step.

According to the piezoelectric vibrator manufacturing method according to the above aspect of the present invention, by forming a penetration hole having a larger diameter than the penetration hole of the base board wafer in a mask member used during the glass frit filling step, it is possible to use the large-diameter penetration hole as the glass frit filling portion. That is, it is possible to improve the production efficiency of the piezoelectric vibrator with a simple configuration.

According to a further aspect of the present invention, there is provided an oscillator in which the piezoelectric vibrator manufactured by the manufacturing method according to the above aspect of the present invention is electrically connected to an integrated circuit as an oscillating piece.

According to a still further aspect of the present invention, there is provided an electronic device in which the piezoelectric vibrator manufactured by the manufacturing method according to the above aspect of the present invention is electrically connected to a timer portion.

According to a still further aspect of the present invention, there is provided a radio-controlled timepiece in which the piezoelectric vibrator manufactured by the manufacturing method according to the above aspect of the present invention is electrically connected to a filter portion.

In the oscillator, electronic device, and radio-controlled timepiece according to the above aspect of the present invention, since they have the piezoelectric vibrator having improved production efficiency, it is possible to improve the production efficiency of the oscillator, electronic device, and radio-controlled timepiece.

According to the package manufacturing method according to the above aspect of the present invention, since the glass frit filling portion having a larger diameter than the penetration hole is formed, it is possible to increase the amount of the glass frit that can be filled at a time. Therefore, although the volume of the glass frit decreases when the glass frit is baked later, the volume of the glass frit after the baking will be increased compared with the related art. That is, it is possible to decrease the number of times of filling (and baking) the glass frit in order to fill a desired amount of glass frit in the penetration hole, and thus the production efficiency of the package can be improved.

DETAILED DESCRIPTION OF THE PREFERRED EMBODIMENTS

Hereinafter, an embodiment of the present invention will be described with reference to FIGS. 1 to 42. In the present embodiment, a piezoelectric vibrator using a tuning-fork type piezoelectric vibrating reed will be described.

Figure 3:
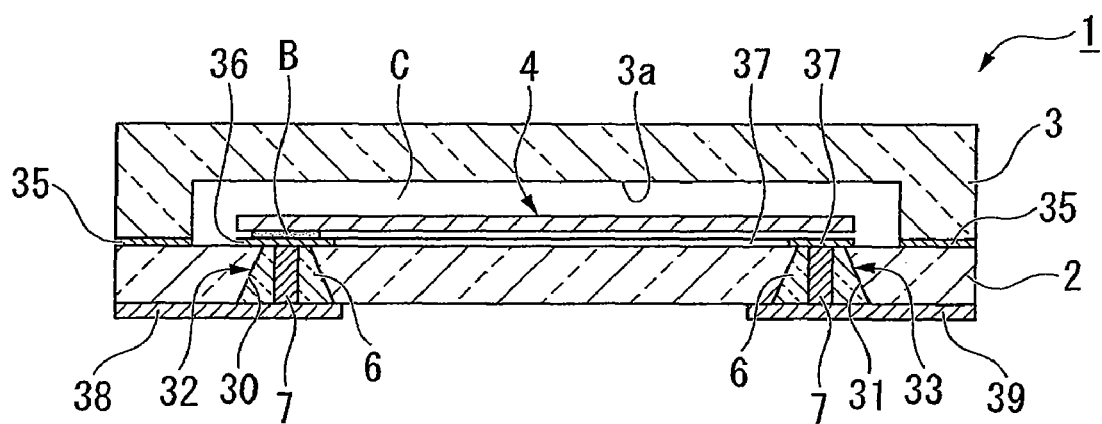
FIG. 3 is a sectional view of the piezoelectric vibrator taken along the line A-A in FIG. 2.
Figure 4:
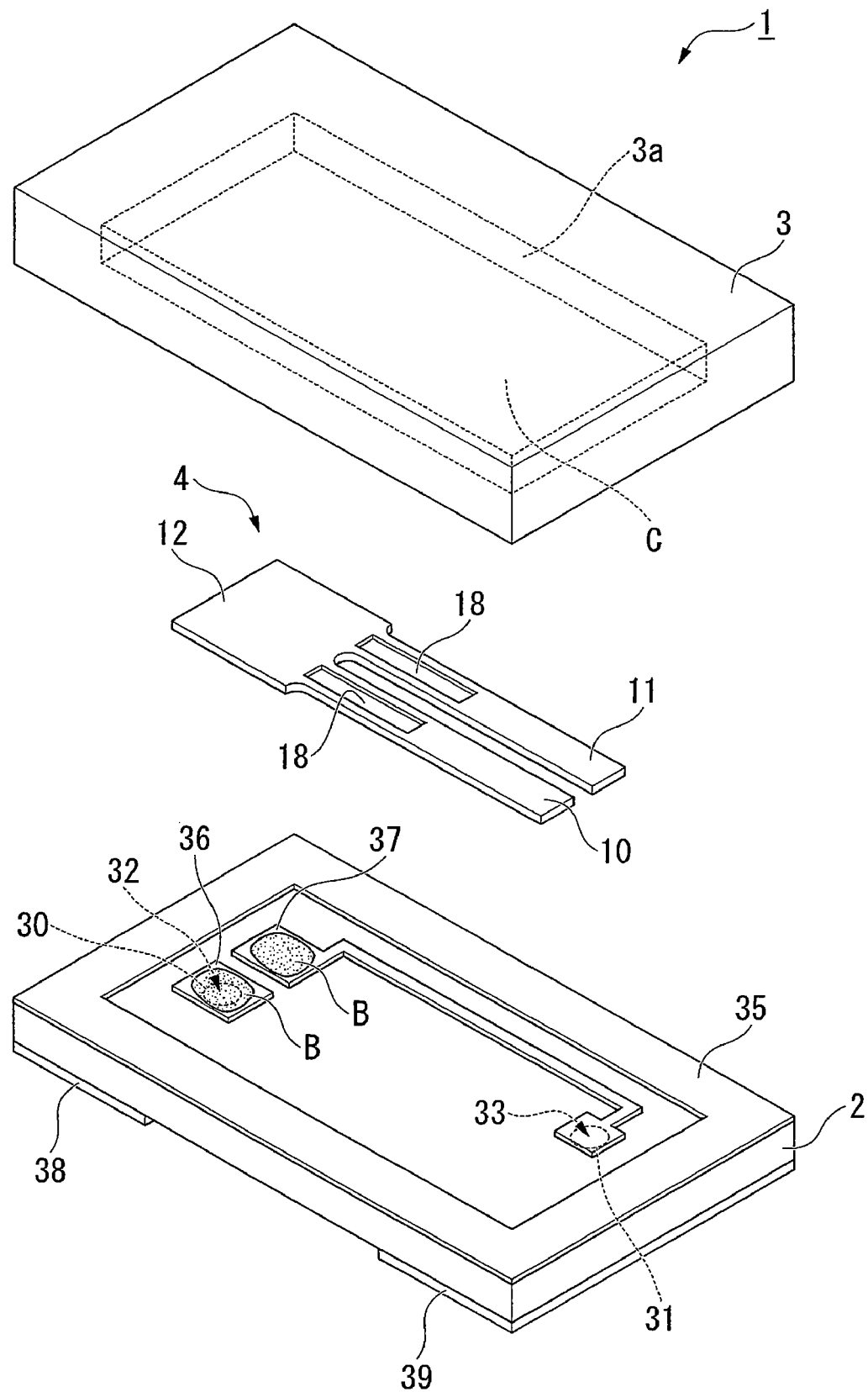
FIG. 4 is an exploded perspective view of the piezoelectric vibrator shown in FIG. 1.

As shown in FIGS. 1 to 4, a piezoelectric vibrator 1 according to the present embodiment is an SMD-type piezoelectric vibrator which is formed in the form of a box laminated in two layers of a base board 2 and a lid board 3 and in which a piezoelectric vibrating reed 4 is accommodated in a cavity C at an inner portion thereof. In FIG. 4, for better understanding of the drawings, illustrations of the excitation electrode 15, extraction electrodes 19 and 20, mount electrodes 16 and 17, and weight metal film 21 are omitted.

Figure 5:
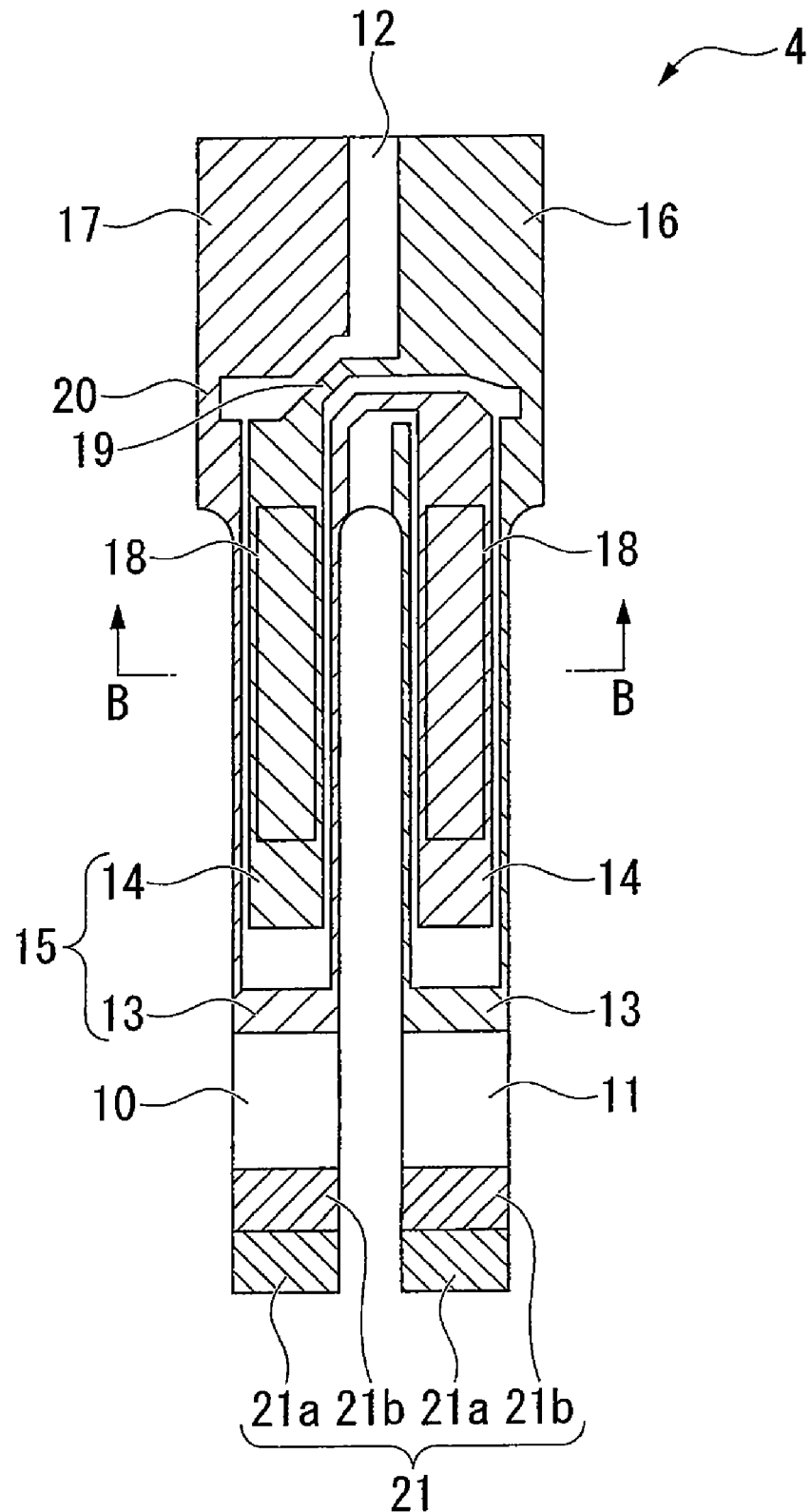
FIG. 5 is a top view of the piezoelectric vibrating reed that constitutes the piezoelectric vibrator shown in FIG. 1.
Figure 6:
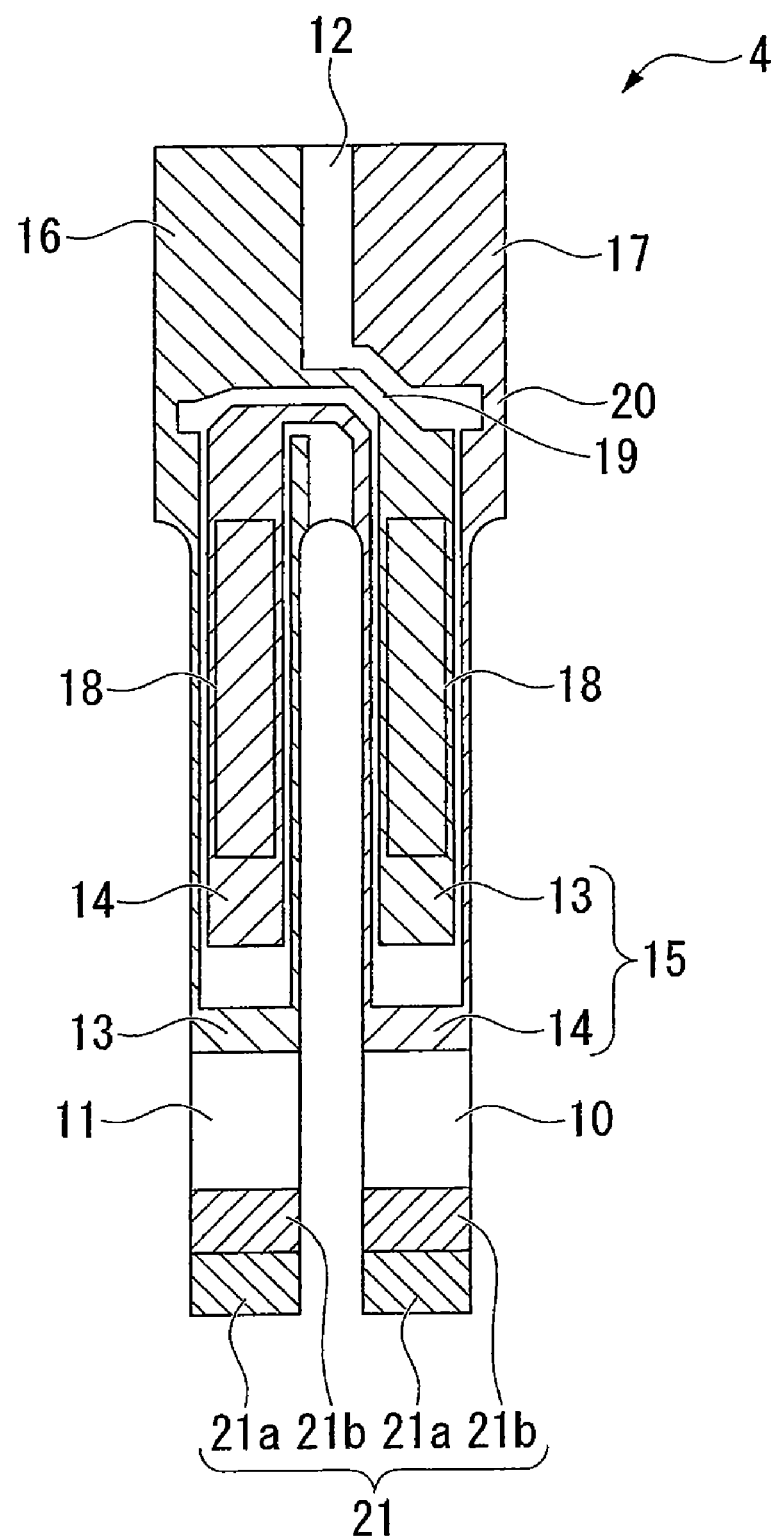
FIG. 6 is a bottom view of the piezoelectric vibrating reed shown in FIG. 5.
Figure 7:
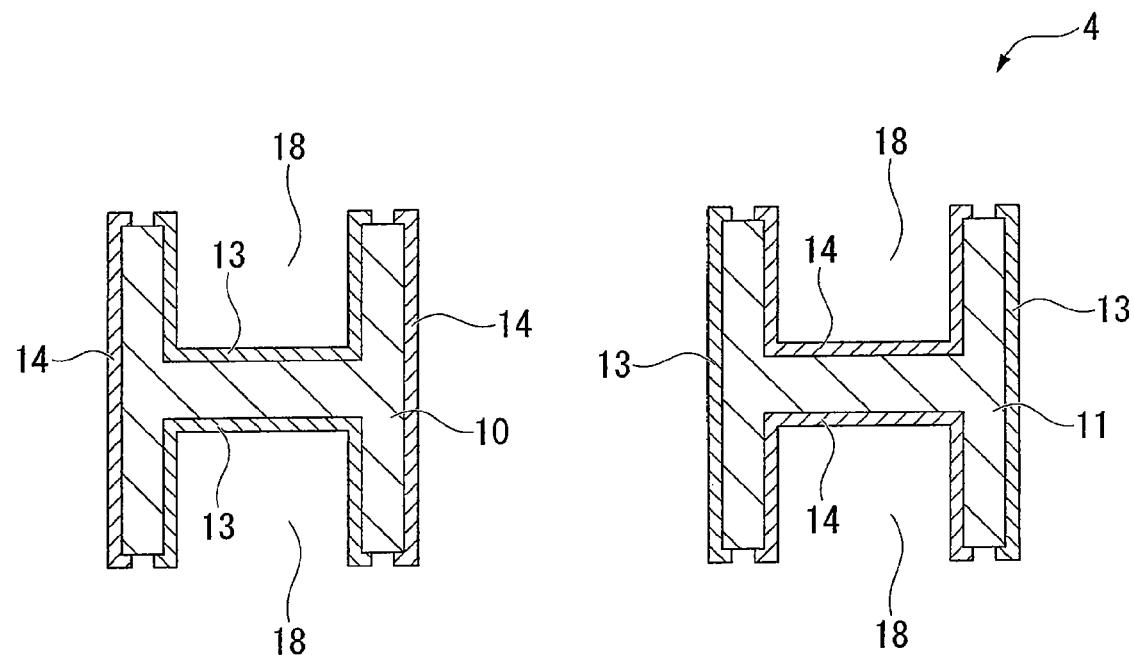
FIG. 7 is a sectional view taken along the line B-B in FIG. 5.

As shown in FIGS. 5 to 7, the piezoelectric vibrating reed 4 is a tuning-fork type vibrating reed which is made of a piezoelectric material such as quartz crystal, lithium tantalate, or lithium niobate and is configured to vibrate when a predetermined voltage is applied thereto.

The piezoelectric vibrating reed 4 includes: a pair of vibrating arms 10 and 11 disposed in parallel to each other; a base portion 12 to which the base end sides of the pair of vibrating arms 10 and 11 are integrally fixed; an excitation electrode 15 which is formed on the outer surfaces of the pair of vibrating arms 10 and 11 so as to allow the pair of vibrating arms 10 and 11 to vibrate and includes a first excitation electrode 13 and a second excitation electrode 14; and mount electrodes 16 and 17 which are electrically connected to the first excitation electrode 13 and the second excitation electrode 14, respectively.

In addition, the piezoelectric vibrating reed 4 according to the present embodiment is provided with groove portions 18 which are formed on both principal surfaces of the pair of vibrating arms 10 and 11 along the longitudinal direction of the vibrating arms 10 and 11. The groove portions 18 are formed so as to extend from the base end sides of the vibrating arms 10 and 11 up to approximately the middle portions thereof.

The excitation electrode 15 including the first excitation electrode 13 and the second excitation electrode 14 is an electrode that allows the pair of vibrating arms 10 and 11 to vibrate at a predetermined resonance frequency in a direction to move closer to or away from each other and is patterned on the outer surfaces of the pair of vibrating arms 10 and 11 in an electrically isolated state. Specifically, the first excitation electrode 13 is mainly formed on the groove portion 18 of one vibrating arm 10 and both side surfaces of the other vibrating arm 11. On the other hand, the second excitation electrode 14 is mainly formed on both side surfaces of one vibrating arm 10 and the groove portion 18 of the other vibrating arm 11.

Moreover, the first excitation electrode 13 and the second excitation electrode 14 are electrically connected to the mount electrodes 16 and 17 via the extraction electrodes 19 and 20, respectively, on both principal surfaces of the base portion 12. A voltage is applied to the piezoelectric vibrating reed 4 via the mount electrodes 16 and 17.

The above-mentioned excitation electrode 15, mount electrodes 16 and 17, and extraction electrodes 19 and 20 are formed by a coating of a conductive film of chromium (Cr), nickel (Ni), aluminum (Al), and titanium (Ti), for example.

Furthermore, the tip ends of the pair of the vibrating arms 10 and 11 are coated with a weight metal film 21 for adjustment of their vibration states (tuning the frequency) of the vibrating arms 10 and 11 in a manner such as to vibrate within a predetermined frequency range. The weight metal film 21 is divided into a rough tuning film 21a used for tuning the frequency roughly and a fine tuning film 21b used for tuning the frequency finely. By tuning the frequency with the use of the rough tuning film 21a and the fine tuning film 21b, the frequency of the pair of the vibrating arms 10 and 11 can be set to fall within the range of the nominal (target) frequency of the device.

The piezoelectric vibrating reed 4 configured in this way is bump-bonded to the upper surface of the base board 2 by bumps B made of gold or the like as shown in FIGS. 3 and 4. More specifically, bump bonding is achieved in a state where the pair of mount electrodes 16 and 17 come into contact with two bumps B formed on the lead-out electrodes 36 and 37, respectively, which are patterned on the upper surface of the base board 2. In this way, the piezoelectric vibrating reed 4 is supported in a state of being floated from the upper surface of the base board 2, and the mount electrodes 16 and 17 and the lead-out electrodes 36 and 37 are electrically connected to each other.

Figure 1:
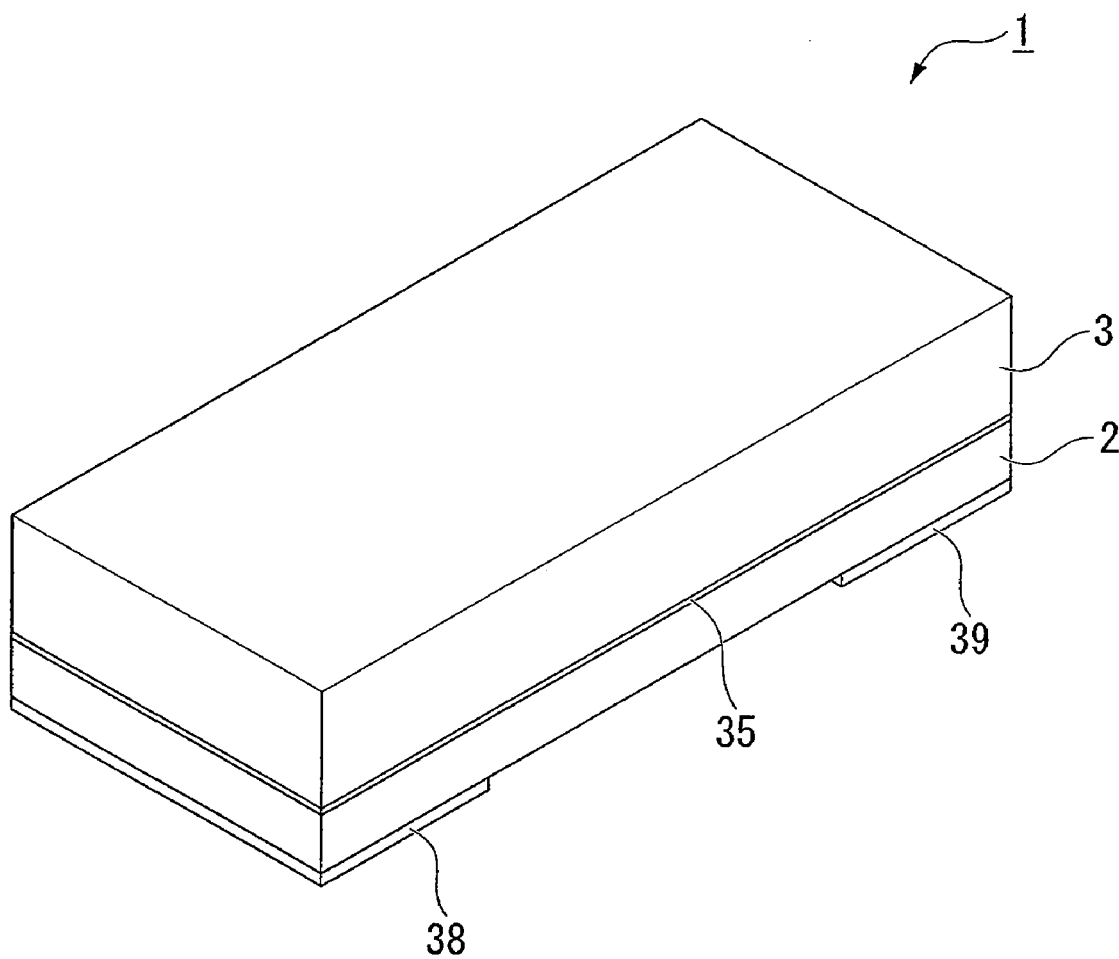
FIG. 1 is a perspective view showing an external appearance of a piezoelectric vibrator according to an embodiment of the present invention.
Figure 2:
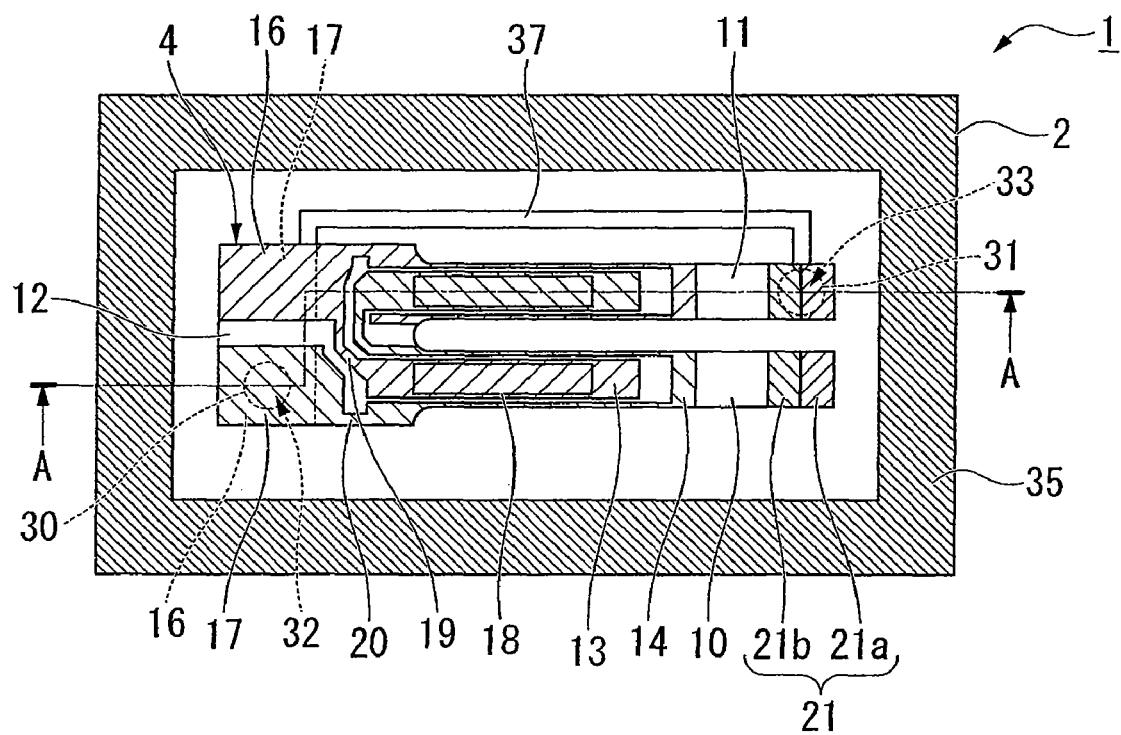
FIG. 2 is a top view showing an inner structure of the piezoelectric vibrator shown in FIG. 1 when a piezoelectric vibrating reed is viewed from above with a lid board removed.

The lid board 3 is a transparent insulating board made of a glass material, for example, soda-lime glass, and is formed in a board-like form as shown in FIGS. 1, 3, and 4. A bonding surface side thereof to be bonded with the base board 2 is formed with a rectangular recess portion 3a in which the piezoelectric vibrating reed 4 is accommodated. The recess portion 3a is a recess portion for a cavity serving as the cavity C that accommodates the piezoelectric vibrating reed 4 when the two boards 2 and 3 are superimposed onto each other. The lid board 3 is anodically bonded to the base board 2 in a state where the recess portion 3a faces the base board 2.

The base board 2 is a transparent insulating board made of glass material, for example, soda-lime glass, similarly to the lid board 3, and is formed in a board-like form having a size capable of being overlapped with the lid board 3, as shown in FIGS. 1 to 4.

The base board 2 is formed with a pair of through-holes (penetration holes) 30 and 31 penetrating through the base board 2. At this time, the pair of through-holes 30 and 31 are formed so as to be received in the cavity C. More specifically, the through-holes 30 and 31 of the present embodiment are formed such that one through-hole 30 is positioned close to the base portion 12 of the mounted piezoelectric vibrating reed 4, and the other through-hole 31 is positioned close to the tip ends of the vibrating arms 10 and 11. In addition, the through-holes 30 and 31 of the present embodiment are formed in a tapered form whose diameter gradually increases from the upper surface of the base board 2 towards the lower surface.

The pair of through-holes 30 and 31 are formed with a pair of penetration electrodes 32 and 33 which are formed so as to bury the through-holes 30 and 31. As shown in FIG. 3, the penetration electrodes 32 and 33 are formed by a cylindrical member 6 and a core portion 7 which are integrally fixed to the through-holes 30 and 31 by baking. The penetration electrodes 32 and 33 serve to maintain air-tightness of the inside of the cavity C by completely closing the through-holes 30 and 31 and achieve electrical connection between the outer electrodes 38 and 39 described later and the lead-out electrodes 36 and 37.

Figure 8:
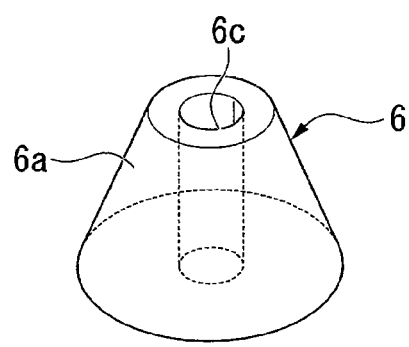
FIG. 8 is a perspective view of a cylindrical member that forms a penetration electrode shown in FIG. 3.

As shown in FIG. 8, the cylindrical member 6 is obtained by baking a paste-like glass frit 6a. The cylindrical member 6 has a cylindrical shape which has flat ends and approximately the same thickness as the base board 2. A core portion 7 is disposed at the center of the cylindrical member 6 so as to penetrate through the cylindrical member 6. In the present embodiment, the cylindrical member 6 has an approximately conical outer shape (a tapered sectional shape) so as to comply with the shapes of the through-holes 30 and 31. As shown in FIG. 3, the cylindrical member 6 is baked in a state of being buried in the through-holes 30 and 31 and is tightly attached to the through-holes 30 and 31.

The core portion 7 is a conductive cylindrical core material made of metallic material, and similarly to the cylindrical member 6, has a shape which has flat ends and approximately the same thickness as the base board 2. As shown in FIG. 3, when the penetration electrodes 32 and 33 are formed as a finished product, the core portion 7 has approximately the same thickness as the base board 2 as described above. However, in the progress of the manufacturing process, the length of the core portion 7 is smaller than the thickness of the base board 2 in the initial state of the manufacturing process (which will be described when describing the manufacturing method). The core portion 7 is positioned at a central hole 6c of the cylindrical member 6, and is tightly attached to the cylindrical member 6 by the baking of the cylindrical member 6. The electrical connection of the penetration electrodes 32 and 33 is secured via the conductive core portion 7.

As shown in FIGS. 1 to 4, the upper surface side of the base board 2 (the bonding surface side to be bonded to the lid board 3) is patterned with a bonding film 35 for anodic bonding and the pair of lead-out electrodes 36 and 37 by a conductive material (for example, aluminum). Among them, the bonding film 35 is formed along the peripheral edge of the base board 2 so as to surround the periphery of the recess portion 3a formed on the lid board 3.

Moreover, the pair of lead-out electrodes 36 and 37 are patterned so that one penetration electrode 32 of the pair of penetration electrodes 32 and 33 is electrically connected to one mount electrode 16 of the piezoelectric vibrating reed 4, and the other penetration electrode 33 is electrically connected to the other mount electrode 17 of the piezoelectric vibrating reed 4.

More specifically, one lead-out electrode 36 is formed right above the one penetration electrode 32 to be disposed right below the base portion 12 of the piezoelectric vibrating reed 4. Moreover, the other lead-out electrode 37 is formed to be disposed right above the other penetration electrode 33 after being led out from a position near the one lead-out electrode 36 towards the tip ends of the vibrating arms 10 and 11 along the vibrating arms 10 and 11.

The bumps B are formed on the pair of lead-out electrodes 36 and 37, and the piezoelectric vibrating reed 4 is mounted via the bumps B. In this way, the one mount electrode 16 of the piezoelectric vibrating reed 4 is electrically connected to the one penetration electrode 32 via the one lead-out electrode 36, and the other mount electrode 17 is electrically connected to the other penetration electrode 33 via the other lead-out electrode 37.

Moreover, the lower surface of the base board 2 is formed with the outer electrodes 38 and 39 which are electrically connected to the pair of penetration electrodes 32 and 33, respectively, as shown in FIGS. 1, 3, and 4. That is, one outer electrode 38 is electrically connected to the first excitation electrode 13 of the piezoelectric vibrating reed 4 via the one penetration electrode 32 and the one lead-out electrode 36. In addition, the other outer electrode 39 is electrically connected to the second excitation electrode 14 of the piezoelectric vibrating reed 4 via the other penetration electrode 33 and the other lead-out electrode 37.

When the piezoelectric vibrator 1 configured in this manner is operated, a predetermined drive voltage is applied between the pair of outer electrodes 38 and 39 formed on the base board 2. In this way, a current can be made to flow to the excitation electrode 15 including the first and second excitation electrodes 13 and 14, of the piezoelectric vibrating reed 4, and the pair of vibrating arms 10 and 11 are allowed to vibrate at a predetermined frequency in a direction to move closer to or away from each other. This vibration of the pair of vibrating arms 10 and 11 can be used as the time source, the timing source of a control signal, the reference signal source, and the like.

Next, a method for manufacturing a plurality of the above-described piezoelectric vibrators 1 at a time using a base board wafer 40 and a lid board wafer 50 will be described with reference to the flowchart shown in FIG. 9.

First, a piezoelectric vibrating reed manufacturing step is performed to manufacture the piezoelectric vibrating reed 4 shown in FIGS. 5 to 7 (S10). Specifically, first, a rough quartz crystal Lambert is sliced at a predetermined angle to obtain a wafer having a constant thickness. Subsequently, the wafer is subjected to crude processing by lapping, and an affected layer is removed by etching. Then, the wafer is subjected to mirror processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrode 15, the extraction electrodes 19 and 20, the mount electrodes 16 and 17, and the weight metal film 21. In this way, a plurality of piezoelectric vibrating reeds 4 can be manufactured.

Moreover, after the piezoelectric vibrating reed 4 is manufactured, rough tuning of a resonance frequency is performed. This rough tuning is achieved by irradiating the rough tuning film 21a of the weight metal film 21 with a laser beam to evaporate in part the rough tuning film 21a, thus changing the weight thereof. Fine tuning of adjusting the resonance frequency more accurately is performed after a mounting step is performed. This fine tuning will be described later.

Figure 10:
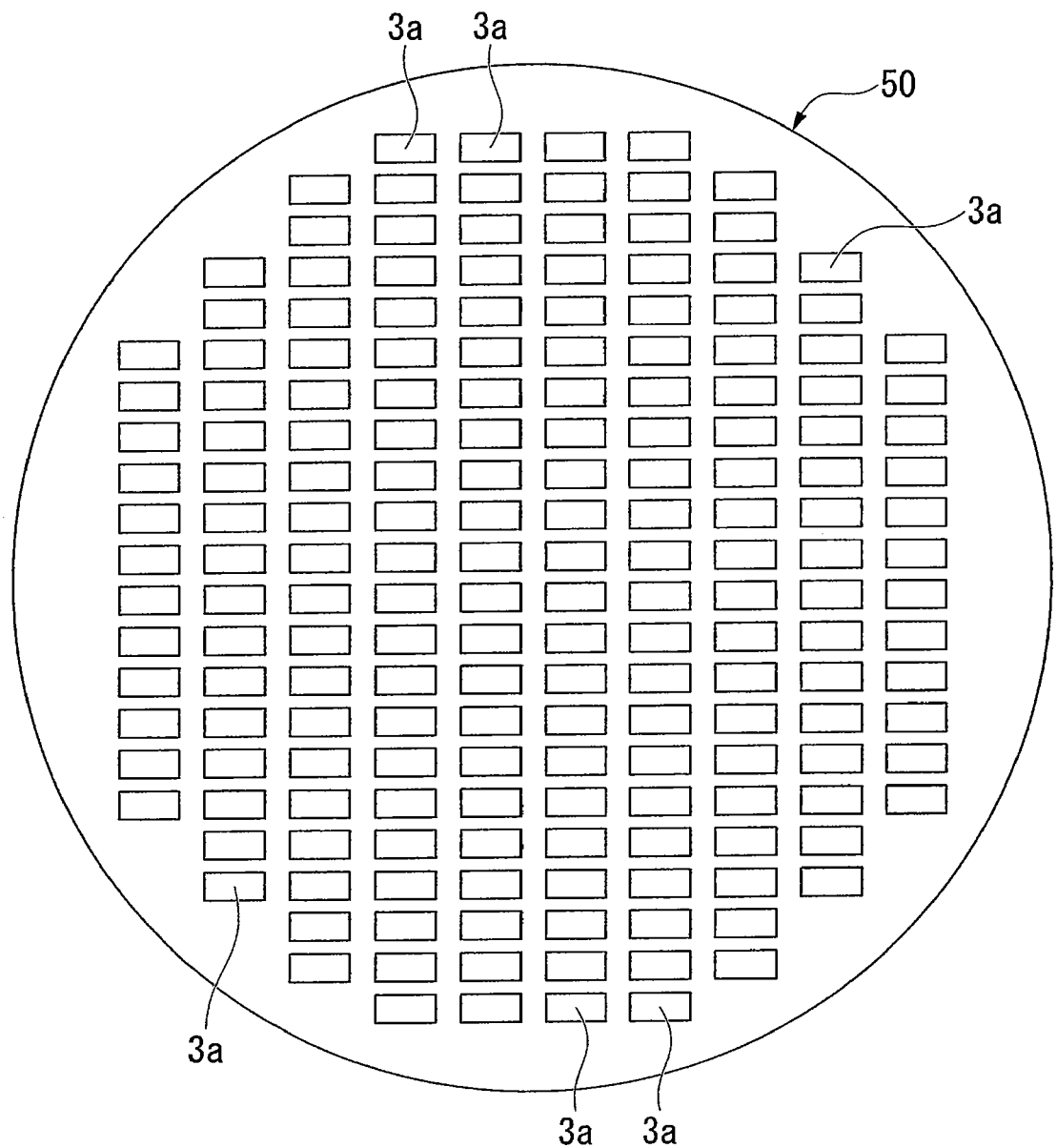
FIG. 10 is a view showing one step of the manufacturing process of the piezoelectric vibrator in accordance with the flowchart shown in FIG. 9, showing a state where a plurality of recess portions is formed on a lid board wafer serving as a base material of a lid board.

Subsequently, a first wafer manufacturing step is performed where the lid board wafer 50 later serving as the lid board 3 is manufactured up to a stage immediately before anodic bonding is achieved (S20). In this step, first, a disk-shaped lid board wafer 50 is formed by polishing a soda-lime glass to a predetermined thickness, cleaning the polished glass, and removing an affected uppermost layer by etching or the like (S21). Subsequently, as shown in FIG. 10, a recess forming step is performed where a plurality of recess portions 3a to be used as a cavity C is formed in a matrix form on the bonding surface of the lid board wafer 50 by etching, press working, or the like (S22). The first wafer manufacturing step ends at this point in time.

Subsequently, at the same or a different time as the first wafer manufacturing step, a second wafer manufacturing step is performed where a base board wafer 40 later serving as the base board 2 is manufactured up to a stage immediately before anodic bonding is achieved (S30). In this step, first, a disk-shaped base board wafer 40 is formed by polishing a soda-lime glass to a predetermined thickness, cleaning the polished glass, and removing an affected uppermost layer by etching or the like (S31). Subsequently, a penetration electrode forming step is performed where a plurality of pairs of penetration electrodes 32 and 33 is formed on the base board wafer 40 (S30A). The penetration electrode forming step will be described in detail below.

Figure 11:
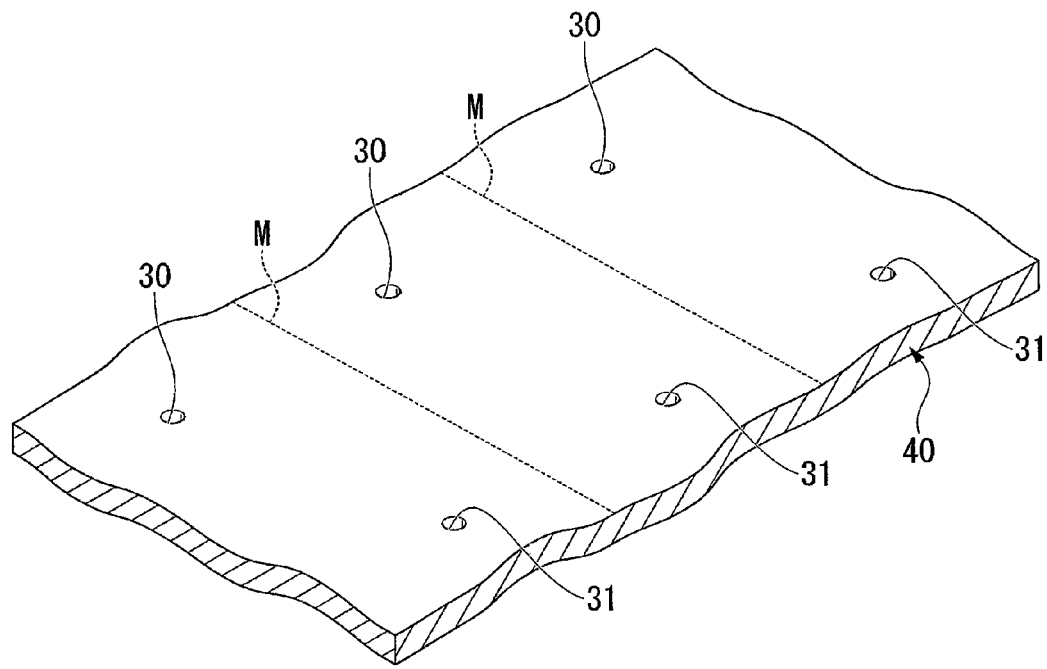
FIG. 11 is a view showing one step of the manufacturing process of the piezoelectric vibrator in accordance with the flowchart shown in FIG. 9, showing a state where a pair of through-holes is formed on a base board wafer serving as a base material of a base board.

First, as shown in FIG. 11, a recess forming step is performed where recess portions 30*a* and 31*a* are formed on the base board wafer 40 so as to correspond to the pair of through-holes 30 and 31 (S32). The dotted line M shown in FIG. 11 is a cutting line along which a cutting step performed later is achieved.

Figure 12:
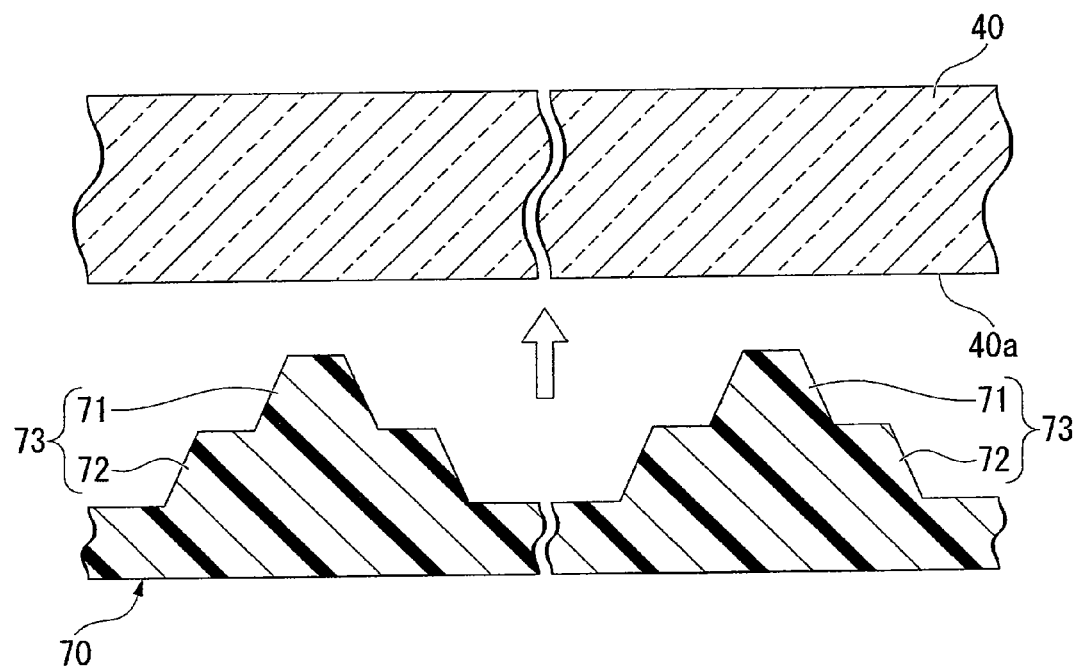
FIG. 12 is a view showing one step of the manufacturing process of the piezoelectric vibrator in accordance with the flowchart shown in FIG. 9, showing a mold member for forming a recess portion for a through-hole in the base board wafer and the base board wafer.
Figure 13:
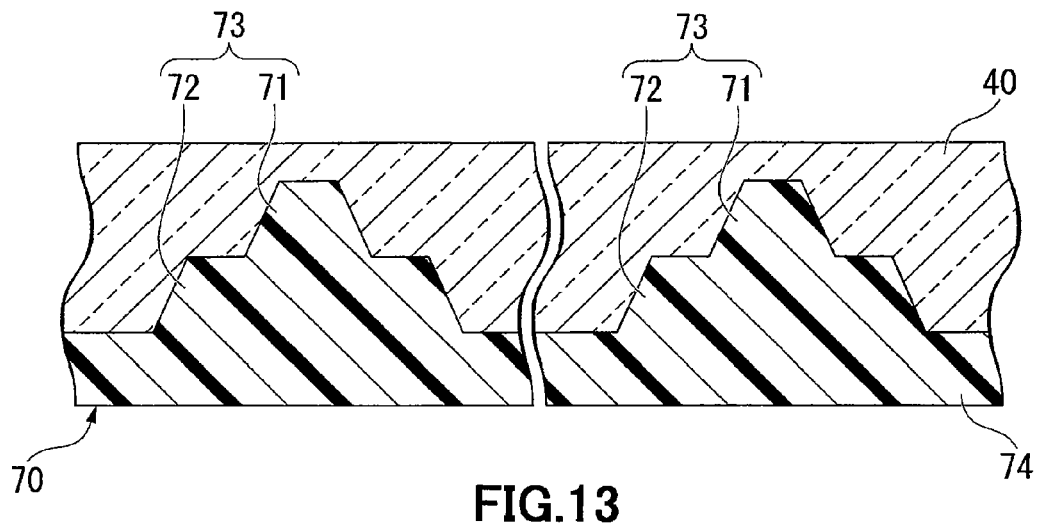
FIG. 13 is a view showing one step of the manufacturing process of the piezoelectric vibrator in accordance with the flowchart shown in FIG. 9, showing a state where the base board wafer and the mold member are in contact with each other.

When the recess portions 30*a* and 31*a* are formed, as shown in FIGS. 12 and 13, a mold member 70 formed with protrusion portions 73 each including a first protrusion portion 71 having approximately the same shape as the through-holes 30 and 31 and a second protrusion portion 72 having a larger diameter than the first protrusion portion 71 is brought into contact with one surface 40*a* of the base board wafer 40 while heating the base board wafer 40. At that time, the protrusion portions 73 are stuck into the base board wafer 40. The mold member 70 includes a board portion 74 having approximately the same outer shape as the base board wafer 40 and the protrusion portions 73 protruding from the board portion 74.

Figure 14:
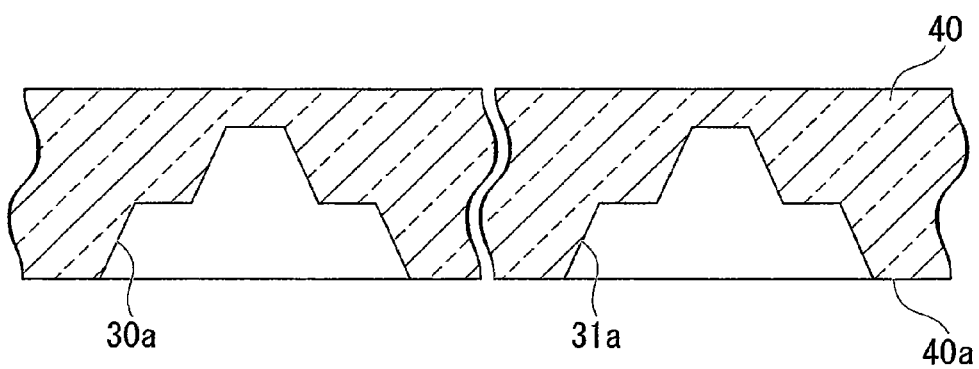
FIG. 14 is a view showing one step of the manufacturing process of the piezoelectric vibrator in accordance with the flowchart shown in FIG. 9, showing a state of the base board wafer when the base board wafer and the mold member are separated from each other.

After that, by separating the mold member 70 from the base board wafer 40 after cooling the base board wafer 40, as shown in FIG. 14, the recess portions 30*a* and 31*a* having approximately the same shape as the protrusion portions 73 are formed on the one surface 40*a* of the base board wafer 40.

Figure 15:
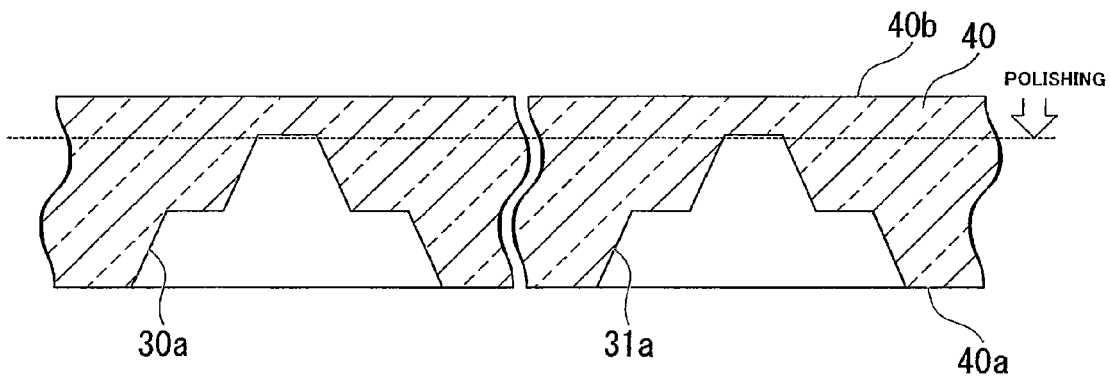
FIG. 15 is a view showing one step of the manufacturing process of the piezoelectric vibrator in accordance with the flowchart shown in FIG. 9, showing a state where the recess portion formed on the base board wafer is polished in order to form the through-hole.

Subsequently, a penetration hole forming step is performed where a plurality of pairs of through-holes 30*b* and 31*b* is formed so as to penetrate through the base board wafer 40 (S33). When the through-holes 30*b* and 31*b* are formed on the base board wafer 40, as shown in FIG. 15, the other surface 40*b* of the base board wafer 40 is polished.

Figure 16:
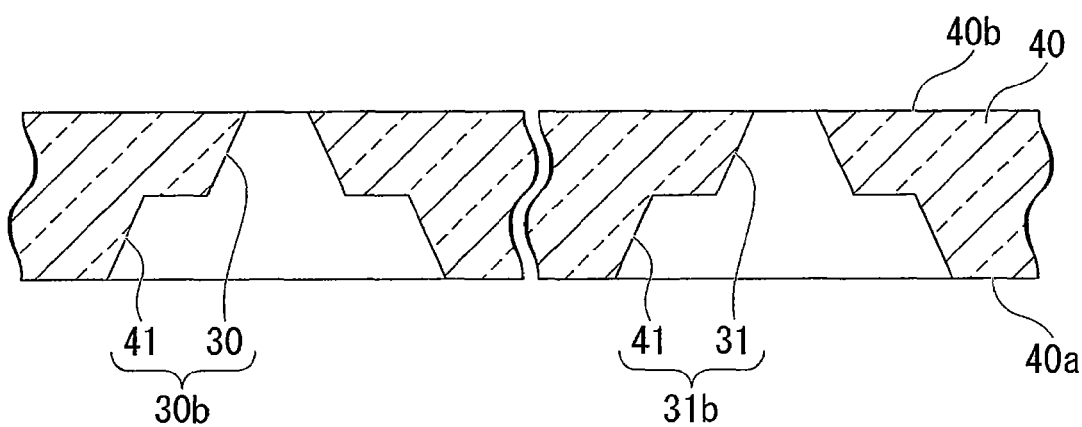
FIG. 16 is a sectional view showing one step of the manufacturing process of the piezoelectric vibrator in accordance with the flowchart shown in FIG. 9, showing the through-hole formed on the base board wafer.

As shown in FIG. 16, on the base board wafer 40, the through-holes 30 and 31 corresponding to the first protrusion portions 71 of the mold member 70 and glass frit filling portions 41 corresponding to the second protrusion portions 72 are formed. That is, the through-hole 30*b* is configured by the through-hole 30 and the glass frit filling portion 41, and the through-hole 31*b* is configured by the through-hole 31 and the glass frit filling portion 41. One through-hole 30 is formed to be positioned close to the base portion 12 of the piezoelectric vibrating reed 4, and the other through-hole 31 is formed to be positioned close to the tip ends of the vibrating arms 10 and 11.

Figure 17:
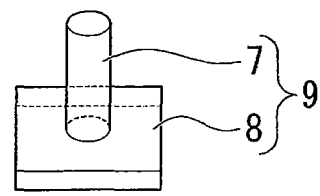
FIG. 17 is a perspective view of a rivet member used for manufacturing the piezoelectric vibrator in accordance with the flowchart shown in FIG. 9.

Subsequently, a penetration electrode alignment step is performed where the core portions 7 of the rivet members 9 are disposed in the plurality of through-holes 30*b* and 31*b*, and a paste-like glass frit 6*a* made of a glass material is filled into the through-holes 30*b* and 31*b* (S34). At that time, as shown in FIG. 17, as the rivet member 9, a conductive rivet member 9 which has a planar base portion 8 and a core portion 7 which extends upwardly from the base portion 8 in a direction approximately perpendicular to the surface of the base portion 8 and has a length shorter than the thickness of the base board wafer 40 and a flat tip end is used.

Figure 18:
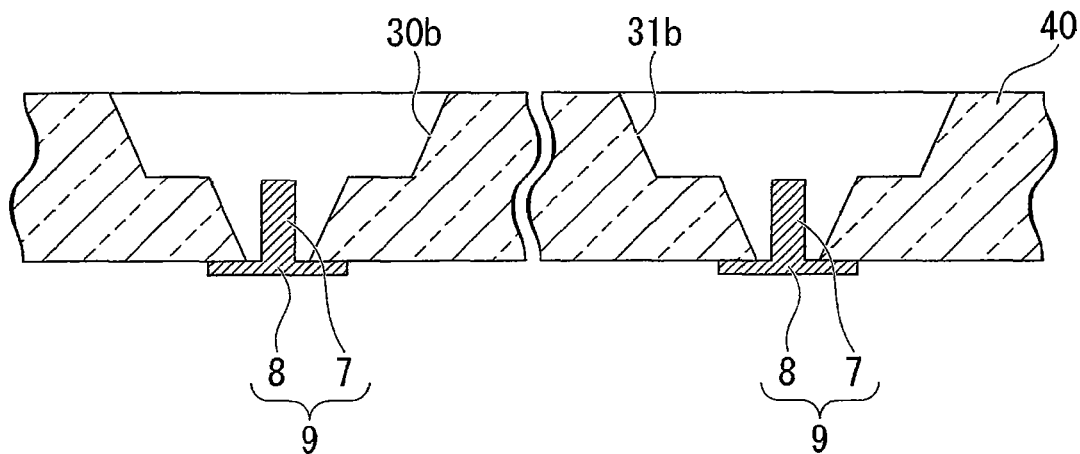
FIG. 18 is a view showing one step of the manufacturing process of the piezoelectric vibrator in accordance with the flowchart shown in FIG. 9, showing a state where the rivet member is disposed in the through-hole.

As shown in FIG. 18, the core portion 7 is inserted until the base portion 8 of the rivet member 9 comes into contact with the base board wafer 40. Here, it is necessary to dispose the rivet member 9 so that the axial direction of the core portion 7 is approximately identical to the axial direction of the through-holes 30 and 31. However, since the rivet member 9 having the core portion 7 formed on the base portion 8 is used, it is possible to make the axial direction of the core portion 7 identical to the axial direction of the through-holes 30 and 31 by a simple operation of pushing the rivet member 9 until the base portion 8 comes into contact with the base board wafer 40. Therefore, it is possible to improve the workability during the penetration electrode alignment step. The core portion 7 has a length such that the tip end thereof is positioned in the vicinity of the boundary of the through-holes 30 and 31 and the glass frit filling portion 41.

In addition, by bringing the base portion 8 into contact with the surface of the base board wafer 40, it is possible to securely fill the paste-like glass frit 6*a* into the through-holes 30*b* and 31*b*.

Since the base portion 8 has a planar shape, the base board wafer 40 can be placed stably on a flat surface of a desk or the like without any rattling during periods between the penetration electrode alignment step and a baking step performed later. In this respect, it is possible to achieve an improvement in the workability.

Figure 19:
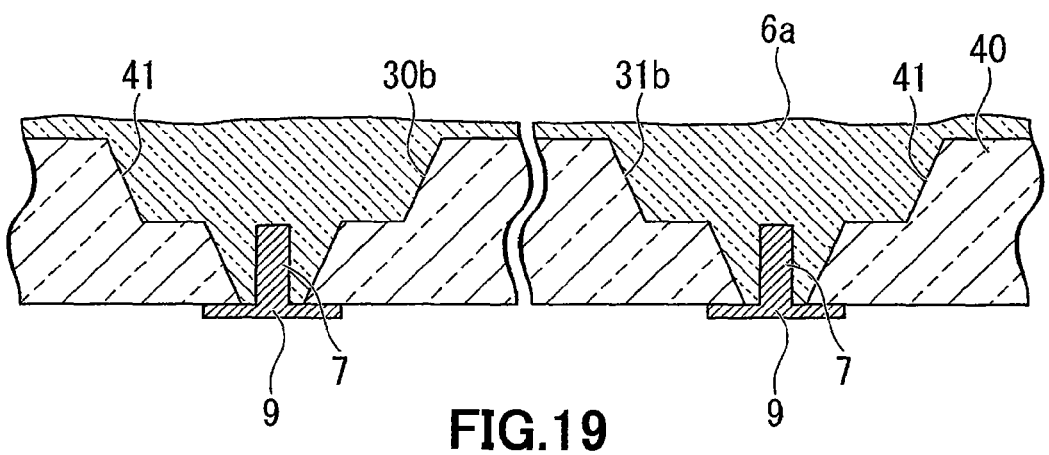
FIG. 19 is a view showing one step of the manufacturing process of the piezoelectric vibrator in accordance with the flowchart shown in FIG. 9, showing a state where a glass frit is filled in the through-hole.
Figure 20:
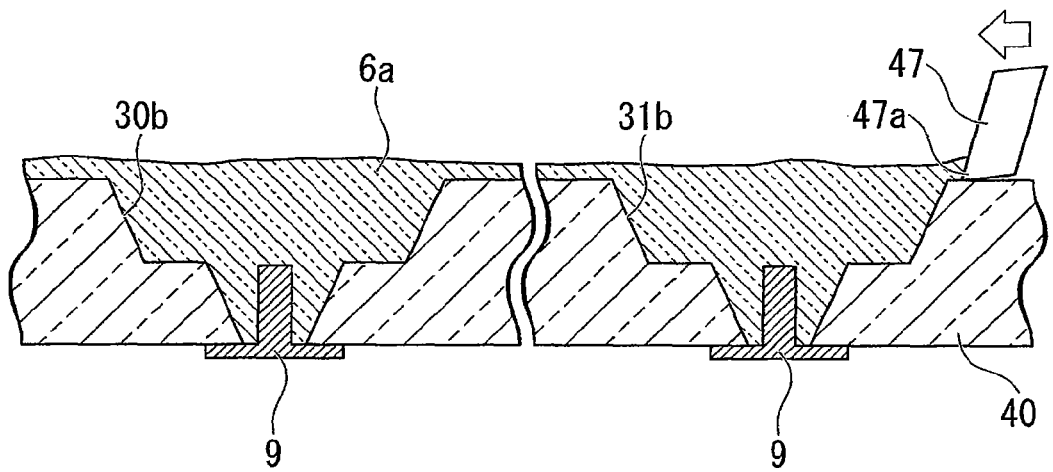
FIG. 20 is a view showing one step of the manufacturing process of the piezoelectric vibrator in accordance with the flowchart shown in FIG. 9, showing a state where a redundant glass frit is being removed.

Moreover, as shown in FIG. 19, when the glass frit 6*a* is filled into the through-holes 30*b* and 31*b*, a sufficient amount of the glass frit 6*a* is applied so that the glass frit 6*a* is securely filled into the through-holes 30*b* and 31*b*. Therefore, the glass frit 6*a* is also applied onto the surface of the base board wafer 40. When the glass frit 6*a* is baked in this state, since a subsequent polishing step may take a lot of time, a glass frit removing step is performed to remove the redundant glass frit 6*a* before the baking (S35). As shown in FIG. 20, in the glass frit removing step, the glass frit 6*a* is removed by moving a squeegee 47 made of resin, for example, along the surface of the base board wafer 40 with a tip end 47*a* of the squeegee 47 coming into contact with the surface of the base board wafer 40.

Figure 21:
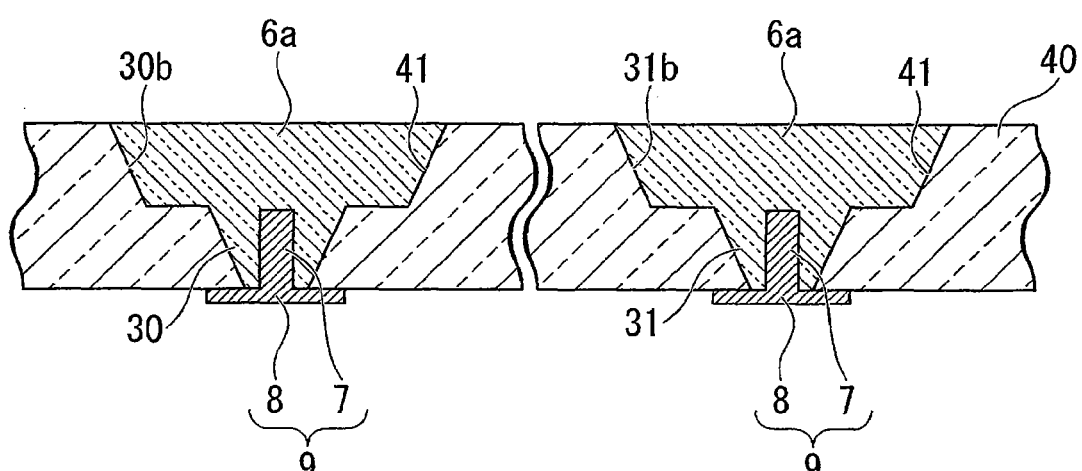
FIG. 21 is a view showing one step of the manufacturing process of the piezoelectric vibrator in accordance with the flowchart shown in FIG. 9, showing a state where the redundant glass frit was removed.

By doing so, as shown in FIG. 21, the redundant glass frit 6*a* can be removed securely by a simple operation. Here, in the present embodiment, the glass frit 6*a* is filled in the through-holes 30*b* and 31*b*. That is, since the glass frit 6*a* is filled in the glass frit filling portions 41 in addition to the through-holes 30 and 31, it is possible to increase the amount of the glass frit 6*a* filled for each through-hole.

Figure 22:
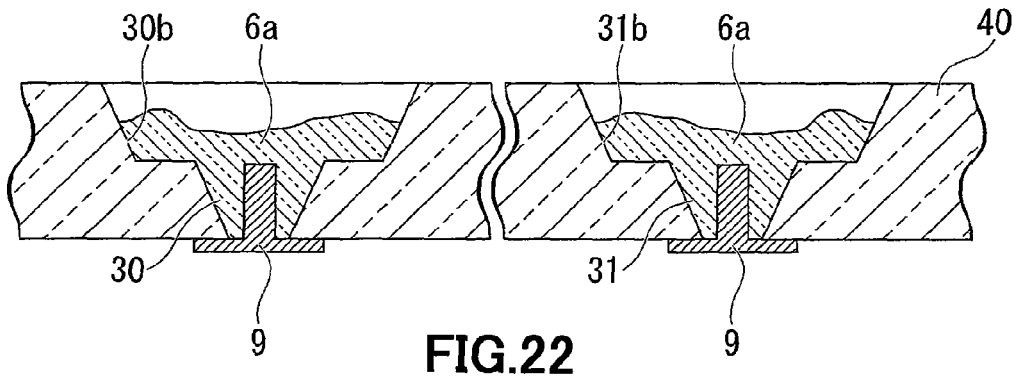
FIG. 22 is a view showing one step of the manufacturing process of the piezoelectric vibrator in accordance with the flowchart shown in FIG. 9, showing a state where the glass frit was baked, subsequent to the state shown in FIG. 21.

Subsequently, a baking step is performed where the buried filling material is baked at a predetermined temperature (S36). In the baking step, the glass frit 6*a* filled in the through-holes 30*b* and 31*b* is dried and sintered. At that time, as shown in FIG. 22, when the glass frit 6*a* is dried, the solvent in the glass frit 6*a* will be evaporated. When the glass frit 6*a* is sintered, the resin in the glass frit 6*a* will be evaporated. Thus, the volume of the glass frit 6*a* will decrease.

However, in the present embodiment, the glass frit filling portions 41 are formed in the through-holes 30*b* and 31*b*, so that the amount of the glass fit 6*a* filled in each of the through-holes 30*b* and 31*b* is increased. Therefore, even when the volume of the glass frit 6*a* decreases, the glass frit 6*a* will be baked in the state of being filled in the through-holes 30 and 31. If the glass frit filling portions 41 were not formed, the core portions 7 would be exposed in the through-holes 30 and 31 when the glass frit 6*a* is baked. Therefore, it is necessary to repeat the filling and baking steps of the glass frit 6*a* several times until the glass frit 6a is filled in the through-holes 30 and 31. However, in the present embodiment, it is possible to decrease the number of times of the steps of filling and baking the glass frit 6a in the through-holes.

By the baking step, the through-holes 30 and 31, the glass frit 6a buried in the through-holes 30 and 31, and the rivet members 9 disposed in the glass frit 6a are attached to each other. Since the baking is performed for each base portion 8, the through-holes 30 and 31 and the rivet members 9 can be integrally fixed to each other in a state where the axial direction of the core portion 7 is approximately identical to the axial direction of the through-holes 30 and 31. The baked glass frit 6a is solidified as the cylindrical member 6.

Figure 23:
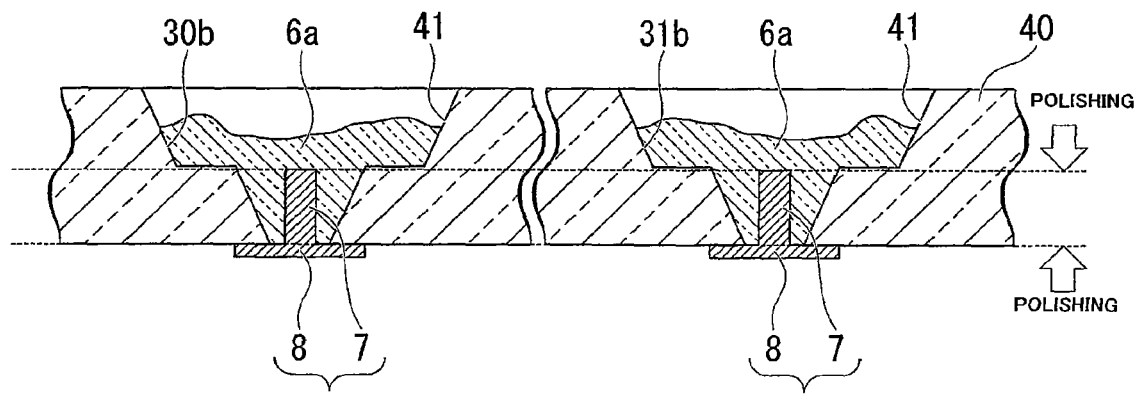
FIG. 23 is a view showing one step of the manufacturing process of the piezoelectric vibrator in accordance with the flowchart shown in FIG. 9, showing a state where a base portion of the rivet member and the base board wafer are being polished, subsequent to the state shown in FIG. 22.

Subsequently, as shown in FIG. 23, after the baking step, a polishing step is performed where both surfaces of the base board wafer 40 are polished so as to remove the base portions 8 of the rivet members 9 and the glass fit filling portions 41 formed on the base board wafer 40 (S37). In this way, it is possible to remove the base portions 8 that achieved positioning of the cylindrical member 6 and the core portions 7, allow only the core portions 7 to remain inside the cylindrical member 6, and remove the glass frit filling portions 41 which was formed to effectively fill the glass frit 6a into the through-holes 30 and 31.

Figure 24:
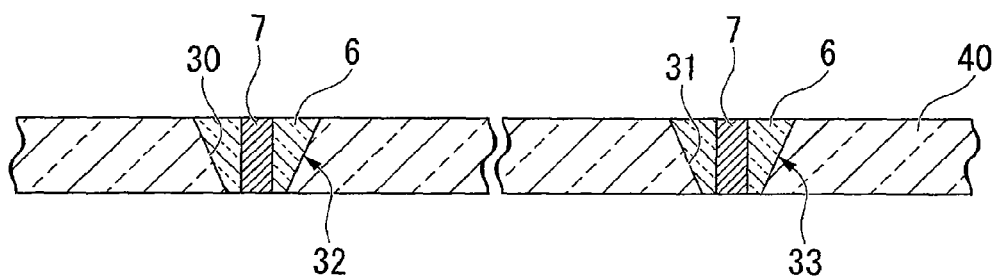
FIG. 24 is a view showing one step of the manufacturing process of the piezoelectric vibrator in accordance with the flowchart shown in FIG. 9, showing a state where the base portion of the rivet member and the base board wafer were polished, subsequent to the state shown in FIG. 23.

Both surfaces of the base board wafer 40 are polished until both ends of the core portion 7 are exposed. As a result, as shown in FIG. 24, it is possible to obtain a plurality of pairs of penetration electrodes 32 and 33 in which the cylindrical member 6 and the core portion 7 are integrally fixed.

As described above, the surfaces of the base board wafer 40 are approximately even with both ends of the cylindrical member 6 and the core portion 7. That is to say, it is possible to make the surfaces of the base board wafer 40 approximately even with the surfaces of the penetration electrodes 32 and 33. The penetration electrode forming step (S30A) ends at the point of time when the polishing step is performed.

Figure 25:
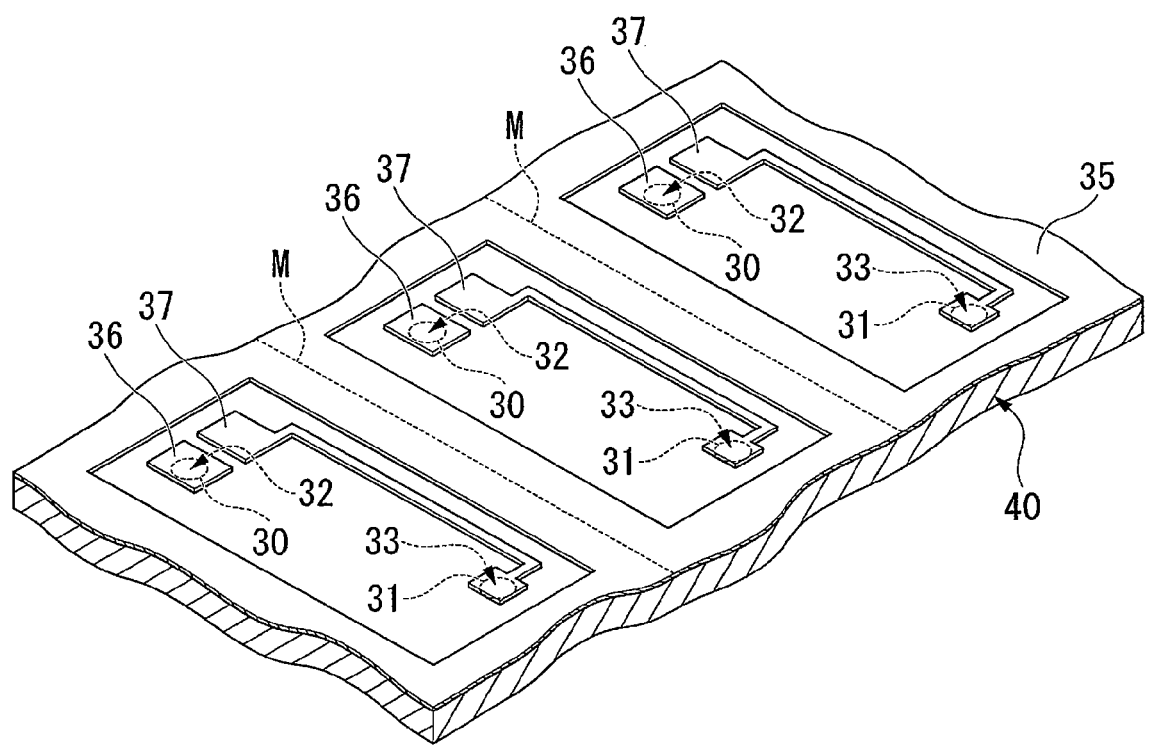
FIG. 25 is a view showing one step of the manufacturing process of the piezoelectric vibrator in accordance with the flowchart shown in FIG. 9, showing a state where a bonding film and a lead-out electrode are patterned on the upper surface of the base board wafer, subsequent to the state shown in FIG. 24.
Figure 26:
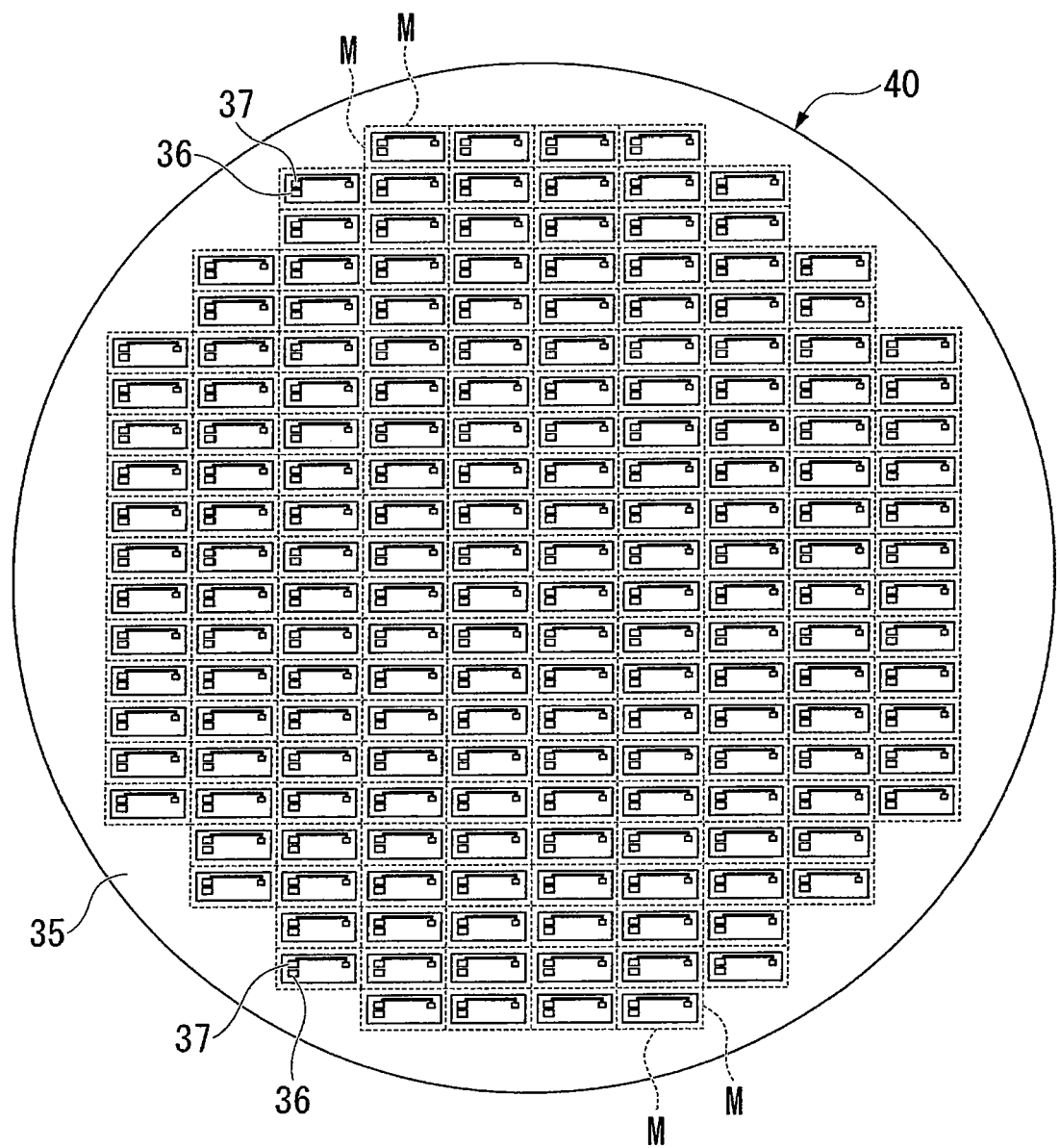
FIG. 26 is an overall view of the base board wafer in the state shown in FIG. 25.

Subsequently, a bonding film forming step is performed where a conductive material is patterned on the upper surface of the base board wafer 40 so as to form a bonding film 35 as shown in FIGS. 25 and 26 (S38). Moreover, a lead-out electrode forming step is performed where a plurality of lead-out electrodes 36 and 37 is formed so as to be electrically connected to each pair of penetration electrodes 32 and 33, respectively (S39). The dotted line M shown in FIGS. 25 and 26 is a cutting line along which a cutting step performed later is achieved.

Particularly, as described above, the penetration electrodes 32 and 33 are approximately even with the upper surface of the base board wafer 40. Therefore, the lead-out electrodes 36 and 37 which are patterned on the upper surface of the base board wafer 40 are closely adhered onto the penetration electrodes 32 and 33 without forming any gap or the like therebetween. In this way, it is possible to achieve reliable electrical connection between the one lead-out electrode 36 and the one penetration electrode 32 and reliable electrical connection between the other lead-out electrode 37 and the other penetration electrode 33. The second wafer manufacturing step ends at this point in time.

Figure 9:
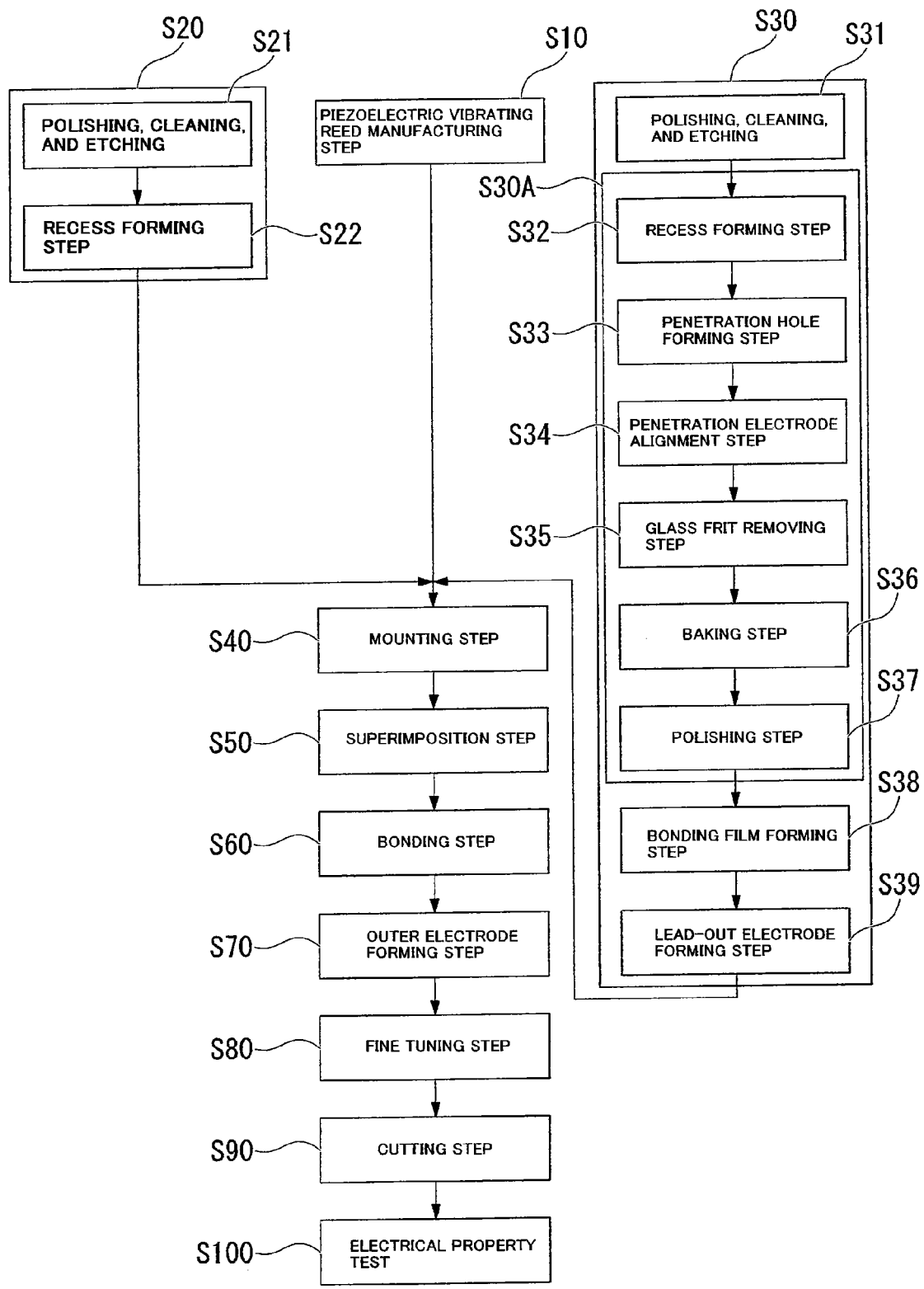
FIG. 9 is a flowchart showing the flow of the manufacturing process of the piezoelectric vibrator shown in FIG. 1.

In FIG. 9, although the lead-out electrode forming step (S39) is performed after the bonding film forming step (S38), conversely, the bonding film forming step (S38) may be performed after the lead-out electrode forming step (S39), and the two steps may be performed at the same time. The same operational effect can be obtained with any order of the steps. Therefore, the order of the steps may be appropriately changed according to the needs.

Subsequently, a mounting step is performed where a plurality of manufactured piezoelectric vibrating reeds 4 is bonded to the upper surface of the base board wafer 40 via the lead-out electrodes 36 and 37 (S40). First, bumps B made of gold or the like are formed on the pair of lead-out electrodes 36 and 37. The base portion 12 of the piezoelectric vibrating reed 4 is placed on the bumps B, and thereafter the piezoelectric vibrating reed 4 is pressed against the bumps B while heating the bumps B to a predetermined temperature. In this way, the piezoelectric vibrating reed 4 is mechanically supported by the bumps B, and the mount electrodes 16 and 17 are electrically connected to the lead-out electrodes 36 and 37. Therefore, at this point in time, the pair of excitation electrodes 15 of the piezoelectric vibrating reed 4 are electrically connected to the pair of penetration electrodes 32 and 33, respectively. Particularly, since the piezoelectric vibrating reed 4 is bump-bonded, the piezoelectric vibrating reed 4 is supported in a state of being floated from the upper surface of the base board wafer 40.

After the piezoelectric vibrating reed 4 is mounted, a superimposition step is performed where the lid board wafer 50 is superimposed onto the base board wafer 40 (S50). Specifically, both wafers 40 and 50 are aligned at a correct position using reference marks or the like not shown in the figure as indices. In this way, the mounted piezoelectric vibrating reed 4 is accommodated in the recess portion 3a formed on the lid board wafer 50, namely in the cavity C which is surrounded by both wafers 40 and 50.

Figure 27:
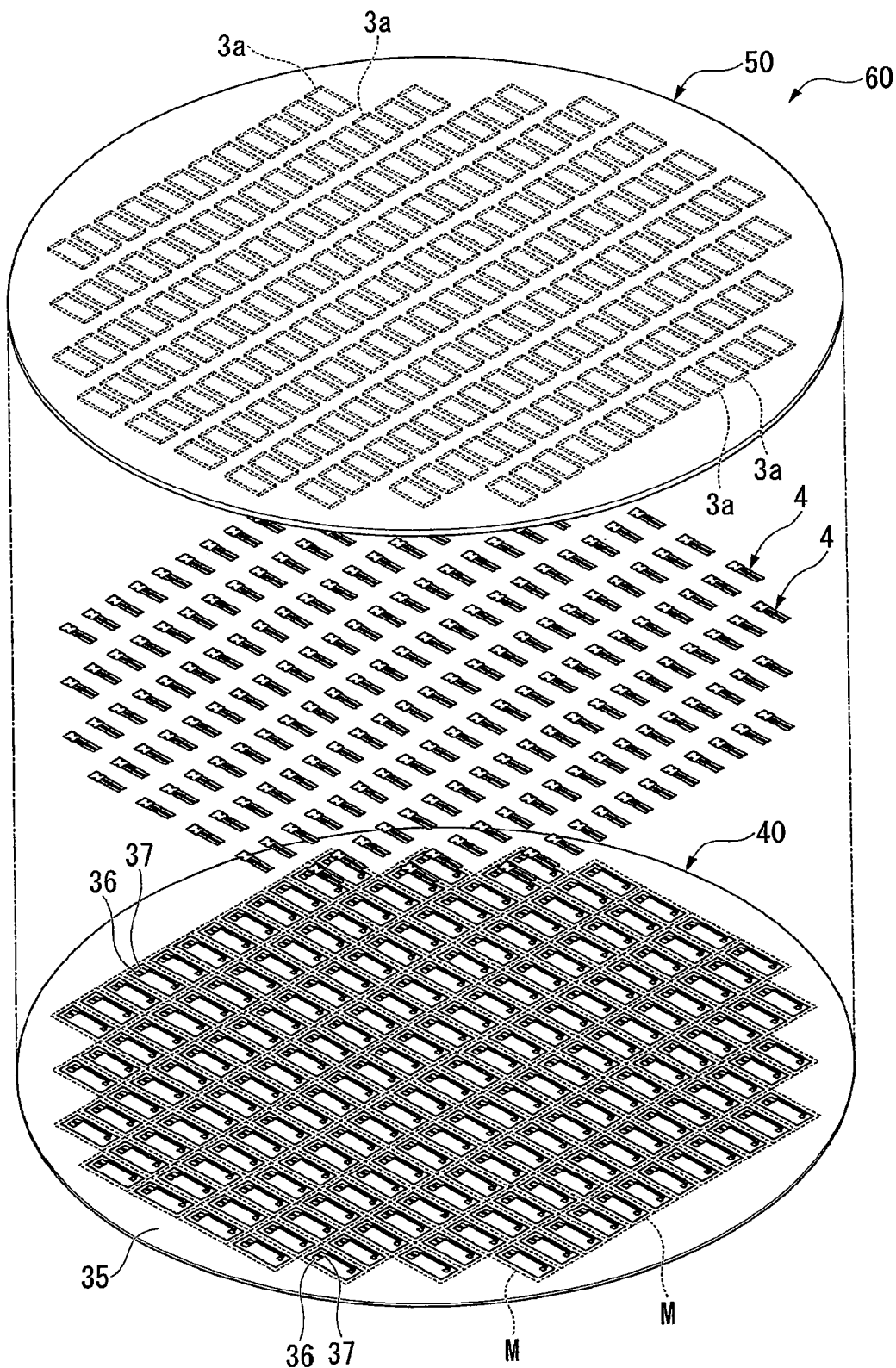
FIG. 27 is an exploded perspective view showing one step of the manufacturing process of the piezoelectric vibrator in accordance with the flowchart shown in FIG. 9, showing a wafer assembly in which the base board wafer and the lid board wafer are anodically bonded with the piezoelectric vibrating reed accommodated in the cavity.

After the superimposition step is performed, a bonding step is performed where the two superimposed wafers 40 and 50 are inserted into an anodic bonding machine not diagrammatically included to achieve anodic bonding under a predetermined temperature atmosphere with application of a predetermined voltage (S60). Specifically, a predetermined voltage is applied between the bonding film 35 and the lid board wafer 50. Then, an electrochemical reaction occurs at an interface between the bonding film 35 and the lid board wafer 50, whereby they are closely adhered tightly and anodically bonded. In this way, the piezoelectric vibrating reed 4 can be sealed in the cavity C, and a wafer assembly 60 shown in FIG. 27 can be obtained in which the base board wafer 40 and the lid board wafer 50 are bonded to each other. In FIG. 27, for better understanding of the figure, the wafer assembly 60 is illustrated in an exploded state. The dotted line M shown in FIG. 27 is a cutting line along which a cutting step performed later is achieved.

When the anodic bonding is performed, since the through-holes 30 and 31 formed on the base board wafer 40 are completely closed by the penetration electrodes 32 and 33, the airtightness in the cavity C will not be impaired by the through-holes 30 and 31. Particularly, since the cylindrical member 6 and the core portion 7 are integrally fixed by the baking, and they are tightly attached to the through-holes 30 and 31, it is possible to reliably maintain airtightness in the cavity C.

After the above-described anodic bonding is completed, an outer electrode forming step is performed where a conductive material is patterned onto the lower surface of the base board wafer 40 so as to form a plurality of pairs of outer electrodes 38 and 39 which is electrically connected to the pair of penetration electrodes 32 and 33 (S70). By this step, the piezoelectric vibrating reed 4 which is sealed in the cavity C can be operated using the outer electrodes 38 and 39.

Particularly, when this step is performed, similarly to the step of forming the lead-out electrodes 36 and 37, since the penetration electrodes 32 and 33 are approximately even with the lower surface of the base board wafer 40, the patterned outer electrodes 38 and 39 are closely adhered onto the penetration electrodes 32 and 33 without forming any gap or the like therebetween. In this way, it is possible to achieve reliable electrical connection between the outer electrodes 38 and 39 and the penetration electrodes 32 and 33.

Subsequently, a fine tuning step is performed on the wafer assembly 60 where the frequencies of the individual piezoelectric vibrators 1 sealed in the cavities C are tuned finely to fall within a predetermined range (S80). Specifically, a voltage is applied to the pair of outer electrodes 38 and 39 which are formed on the lower surface of the base board wafer 40, thus allowing the piezoelectric vibrating reeds 4 to vibrate. A laser beam is irradiated onto the lid board wafer 50 from the outer side while measuring the vibration frequencies to evaporate the fine tuning film 21b of the weight metal film 21. In this way, since the weight on the tip end sides of the pair of vibrating arms 10 and 11 decreases, the fine tuning can be performed in such a way that the frequency of the piezoelectric vibrating reed 4 falls within the predetermined range of the nominal frequency.

After the fine tuning of the frequency is completed, a cutting step is performed where the bonded wafer assembly 60 is cut along the cutting line M shown in FIG. 27 to obtain small fragments (S90). As a result, a plurality of two-layered SMD-type piezoelectric vibrators 1 shown in FIG. 1, in which the piezoelectric vibrating reed 4 is sealed in the cavity C formed between the base board 2 and the lid board 3 being anodically bonded together, can be manufactured at a time.

The fine tuning step (S80) may be performed after performing the cutting step (S90) to obtain the individual fragmented piezoelectric vibrators 1. However, as described above, by performing the fine tuning step (S80) earlier, since the fine tuning step can be performed on the wafer assembly 60, it is possible to perform the fine tuning on the plurality of piezoelectric vibrators 1 more efficiently. Therefore, it is desirable because throughput can be increased.

Subsequently, an electrical property test of the piezoelectric vibrating reed 4 is conducted (S100). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance properties and the like are compared and checked as well. Finally, an external appearance test of the piezoelectric vibrator 1 is conducted to check the dimensions, the quality, and the like. In this way, the manufacturing of the piezoelectric vibrator 1 ends.

According to the present embodiment, since the through-holes 30 and 31 and the through-holes 30b and 31b having the glass frit filling portions 41 each having a larger diameter than the through-holes 30 and 31 are formed on the base board wafer 40, it is possible to increase the amount of the glass frit 6a that can be filled at a time. Therefore, although the volume of the glass frit 6a decreases when the glass frit 6a is baked later, the volume of the glass frit 6a after the baking will be increased compared with the related art. That is, it is possible to decrease the number of times of filling (and baking) the glass frit 6a in order to fill a desired amount of glass frit 6a in the through-holes 30b and 31b, and thus the production efficiency of the piezoelectric vibrator 1 can be improved.

In addition, the through-holes 30b and 31b are formed on the base board wafer 40 using the mold member 70 having the protrusion portions 73 corresponding to the through-holes 30 and 31 and the glass frit filling portions 41. That is to say, it is possible to improve the production efficiency of the piezoelectric vibrator 1 with a simple configuration.

According to the piezoelectric vibrator 1 manufactured by the manufacturing method according to the present invention, the penetration electrodes 32 and 33 can be closely adhered securely to the lead-out electrodes 36 and 37 and the outer electrodes 38 and 39. As a result, it is possible to secure stable electrical connection between the piezoelectric vibrating reed 4 and the outer electrodes 38 and 39 and improve the reliability in operational performance to achieve higher performance. In addition, since the penetration electrodes 32 and 33 are formed by the conductive core portions 7, it is possible to obtain a very stable electrical connection.

In addition, since reliable airtightness in the cavity C can be maintained, it is possible to achieve high quality.

In addition, according to the manufacturing method of the present invention, since a plurality of piezoelectric vibrators 1 can be manufactured at a time, it is possible to achieve cost reduction.

Oscillator

Next, an oscillator according to an embodiment of the present invention will be described with reference to FIG. 28.

Figure 28:
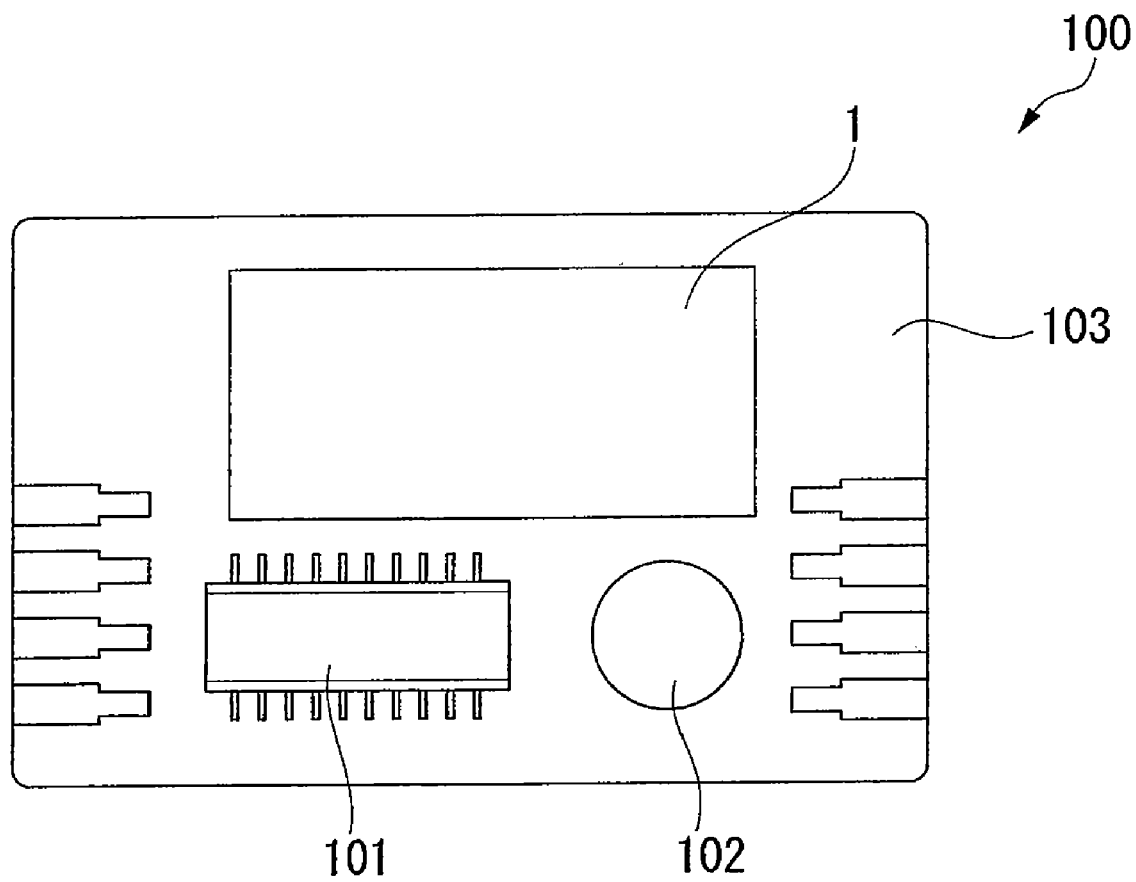
FIG. 28 is a view showing the configuration of an oscillator according to an embodiment of the present invention.

As shown in FIG. 28, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrator 1 is mounted in the vicinity of the integrated circuit 101. The electronic component 102, integrated circuit 101, and piezoelectric vibrator 1 are electrically connected by a wiring pattern which is not shown. It should be noted that these components are molded by resin which is not shown.

In the oscillator 100 configured in this manner, the piezoelectric vibrating reed 4 in the piezoelectric vibrator 1 vibrates when a voltage is applied to the piezoelectric vibrator 1. This vibration is converted to an electrical signal by the piezoelectric characteristics of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Timepiece) module, according to the demands, it is possible to add a function of controlling the date or time for operating the device or an external device or providing the time or calendar other than a single-function oscillator for a timepiece.

According to the oscillator 100 of the present embodiment, since the oscillator includes the piezoelectric vibrator 1 having improved production efficiency, it is possible to achieve improvement in the production efficiency of the oscillator 100 itself.

Electronic Device

Figure 29:
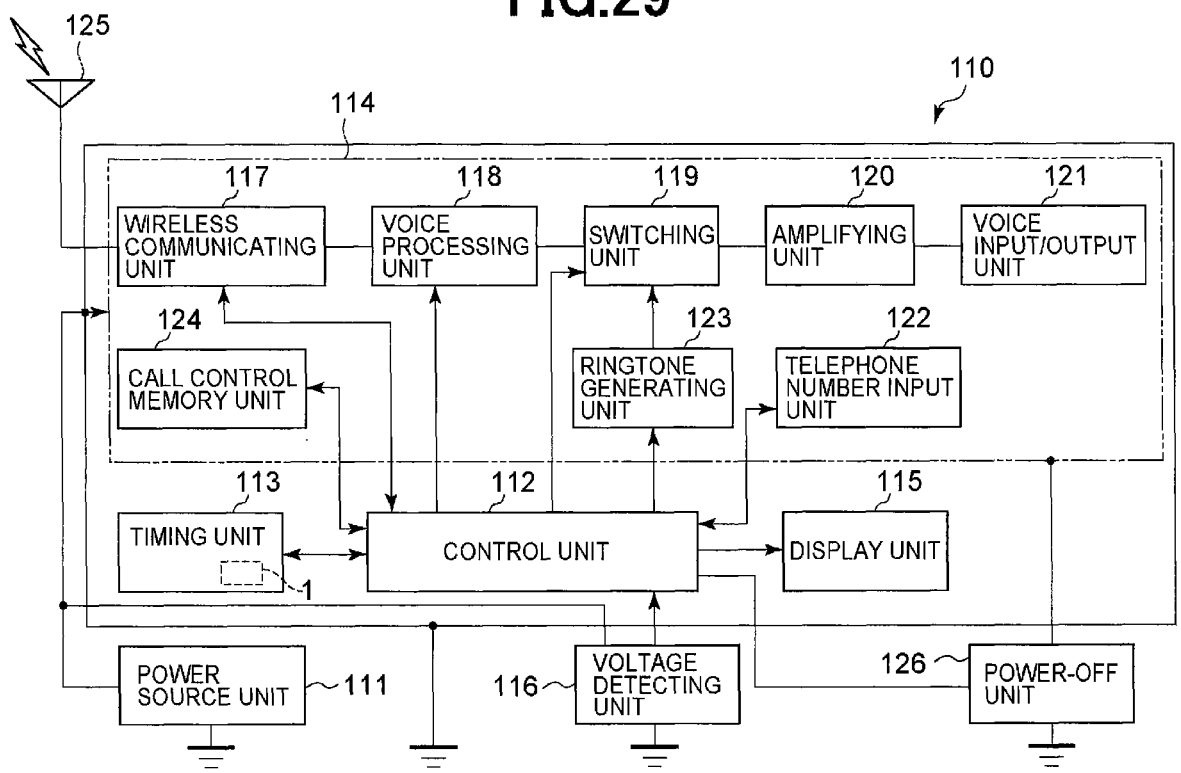
FIG. 29 is a view showing the configuration of an electronic device according to an embodiment of the present invention.

Next, an electronic device according to an embodiment of the present invention will be described with reference to FIG. 29. The present embodiment will be described by way of an example of a portable information device 110 having the piezoelectric vibrator 1 as an example of the electronic device.

First, the portable information device 110 of the present embodiment is represented, for example, by a cellular phone and is one that developed and improved a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and makes communications as with a cellular phone of the related art using the internal speaker and microphone on the inner side of its strap. However, the portable information device 110 is remarkably small and light compared with the cellular phone of the related art. Next, the configuration of the portable information device 110 of the present embodiment will be described. As shown in FIG. 29, the portable information device 110 includes the piezoelectric vibrator 1 and a power supply portion 111 for supplying power. The power supply portion 111 is formed, for example, of a lithium secondary battery. The power supply portion 111 is connected in parallel to a control portion 112 that performs various kinds of control, a timer portion 113 that counts the time or the like, a communication portion 114 that performs communication with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive sound data and operations to count and display the current time. The control portion 112 includes a ROM in which a program is written in advance, a CPU that reads out and runs the program written to the ROM, a RAM used as a work area of the CPU, and the like.

The timer portion 113 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric characteristics of the quartz and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, a sound processing portion 118, a switching portion 119, an amplifier portion 120, a sound input/output portion 121, a telephone number input portion 122, a ring tone generation portion 123, and a call control memory portion 124.

The wireless portion 117 carries out transmission and reception of various kinds of data, such as sound data, with the base station via an antenna 125. The sound processing portion 118 encodes and decodes a sound signal input therein from the wireless portion 117 or the amplifier portion 120. The amplifier portion 120 amplifies a signal input therein from the sound processing portion 118 or the sound input/output portion 121 to a predetermined level. The sound input/output portion 121 is formed of a speaker and a microphone, and makes a ring tone and an incoming sound louder as well as collects sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is output to the sound input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, is about 3 V. Upon receipt of a notification of a voltage drop from the voltage detection portion 116, the control portion 112 disables the operation of the wireless portion 117, the sound processing portion 118, the switching portion 119, and the ring tone generation portion 123. In particular, it is essential to stop the operation of the wireless portion 117 that consumes a large amount of power. Furthermore, a message informing that the communication portion 114 becomes unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the portable information device 110 of the present embodiment, since the portable information device includes the piezoelectric vibrator having improved production efficiency, it is possible to improve the production efficiency of the portable information device 110.

Radio-Controlled Timepiece

Next, a radio-controlled timepiece 130 according to an embodiment of the present invention will be described with reference to FIG. 30.

Figure 30:
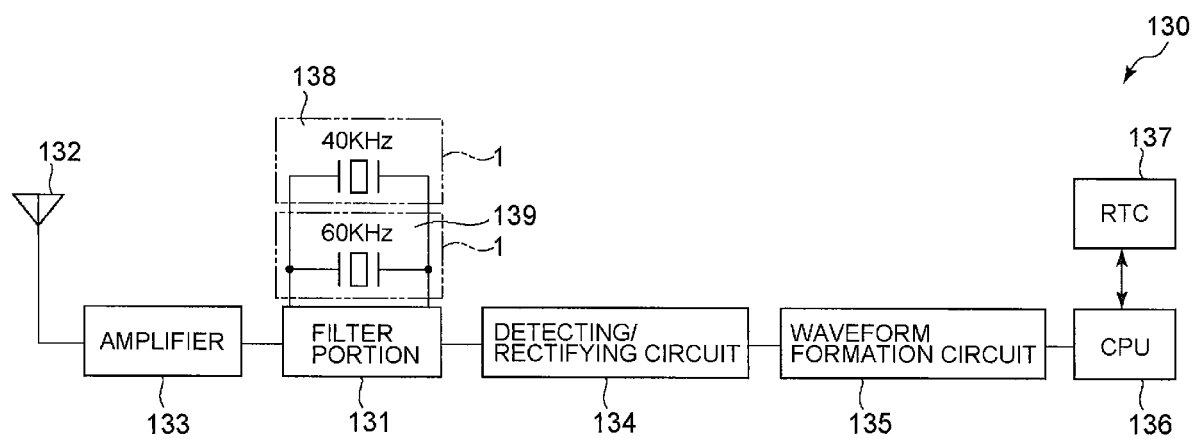
FIG. 30 is a view showing the configuration of a radio-controlled timepiece according to an embodiment of the present invention.

As shown in FIG. 30, the radio-controlled timepiece 130 of the present embodiment includes the piezoelectric vibrators 1 electrically connected to a filter portion 131. The radio-controlled timepiece 130 is a timepiece provided with the function of displaying the correct time by automatically correcting the time upon receipt of a standard radio wave including the timepiece information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has a nature to propagate along the land surface and a nature to propagate while reflecting between the ionospheric layer and the land surface, and therefore has a propagation range wide enough to cover all Japan by the two transmission centers.

Hereinafter, the functional configuration of the radio-controlled timepiece 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 1.

In the present embodiment, the piezoelectric vibrators 1 include quartz vibrator portions 138 and 139 having resonance frequencies at 40 kHz and 60 kHz which are the same as the carrier frequency.

Furthermore, the filtered signal at the predetermined frequency is detected and demodulated by a detection and rectification circuit 134. Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given using an example in Japan, the frequency of the long standard wave is different overseas. For example, a standard wave of 77.5 kHz is used in Germany. When the radio-controlled timepiece 130 which is also operable overseas is incorporated into a portable device, the piezoelectric vibrator 1 set at the frequency different from the frequencies used in Japan is required.

According to the radio-controlled timepiece 130 of the present embodiment, since the radio-controlled timepiece includes the piezoelectric vibrator having improved production efficiency, it is possible to improve the production efficiency of the radio-controlled timepiece 130.

Although the embodiments of the present invention have been described in detail with reference to the drawings, the detailed configuration is not limited to the embodiments, and various changes can be made in design without departing from the spirit of the present invention.

For example, although in the above-described embodiment, the through-holes 30 and 31 have a conical shape having a tapered sectional shape, they may have an approximately cylindrical shape having a straight shape rather than the tapered sectional shape. In this case, approximately the same operational effect can be obtained by forming the glass frit filling portions 41 having a larger diameter than the through-holes 30 and 31.

In addition, in the above-described embodiment, it is preferable that the core portion 7 has approximately the same thermal expansion coefficient as the base board 2 (base board wafer 40) and the cylindrical member 6.

In this case, when baking is performed, the three members, namely the base board wafer 40, the cylindrical member 6, and the core portion 7 will experience the same thermal expansion. Therefore, there will be no problems resulting from the different thermal expansion coefficients, for example, a case where excessive pressure is applied to the base board wafer 40 or the cylindrical member 6, thus forming cracks or the like, and a case where a gap is formed between the cylindrical member 6 and the through-holes 30 and 31 or between the cylindrical member 6 and the core portion 7. Therefore, it is possible to form the penetration electrodes having higher quality, and accordingly, to achieve a further improvement in the quality of the piezoelectric vibrator 1.

For example, although the above-described embodiments have been described by way of an example of the grooved piezoelectric vibrating reed 4 in which the groove portions 18 are formed on both surfaces of the vibrating arms 10 and 11 as an example of the piezoelectric vibrating reed 4, the piezoelectric vibrating reed 4 may be a type of piezoelectric vibrating reed without the groove portions 18. However, since the field efficiency between the pair of the excitation electrodes 15 when a predetermined voltage is applied to the pair of excitation electrodes 15 can be increased by forming the groove portions 18, it is possible to suppress the vibration loss further and to improve the vibration properties much more. That is to say, it is possible to decrease the CI value (crystal impedance) further and to improve the performance of the piezoelectric vibrating reed 4 further. In this respect, it is preferable to form the groove portions 18.

In addition, although the embodiment has been described by way of an example of a tuning-fork type piezoelectric vibrating reed 4, the piezoelectric vibrating reed of the present invention is not limited to the tuning-fork type piezoelectric vibrating reed but may be a thickness-shear type piezoelectric vibrating reed, for example.

Moreover, although in the above-described embodiments, the base board 2 and the lid board 3 are anodically bonded by the bonding film 35, the bonding method is not limited to the anodic bonding. However, anodic bonding is preferable because the anodic bonding can tightly bond both boards 2 and 3.

Furthermore, although in the above-described embodiments, the piezoelectric vibrating reed 4 is bonded by bumps, the bonding method is not limited to bump bonding. For example, the piezoelectric vibrating reed 4 may be bonded by a conductive adhesive agent. However, since the bump bonding allows the piezoelectric vibrating reed 4 to be floated from the upper surface of the base board 2, it is naturally possible to secure the minimum vibration gap necessary for vibration of the piezoelectric vibrating reed 4. Therefore, bump bonding is preferable.

Furthermore, although the above-described embodiment has been described for the case where the glass frit filling portions 41 were formed on the base board wafer 40, the present invention is not limited to this. For example, glass frit filling portions 56 may be formed on a mask member 55 which is provided to protect the base board wafer 40 when removing the redundant glass frit 6a during the glass frit removing step. The penetration electrode forming step for this case will be described below.

First, as shown in FIG. 11, a recess forming step is performed where recess portions 30a and 31a are formed on the base board wafer 40 so as to correspond to the pair of through-holes 30 and 31.

Figure 31:
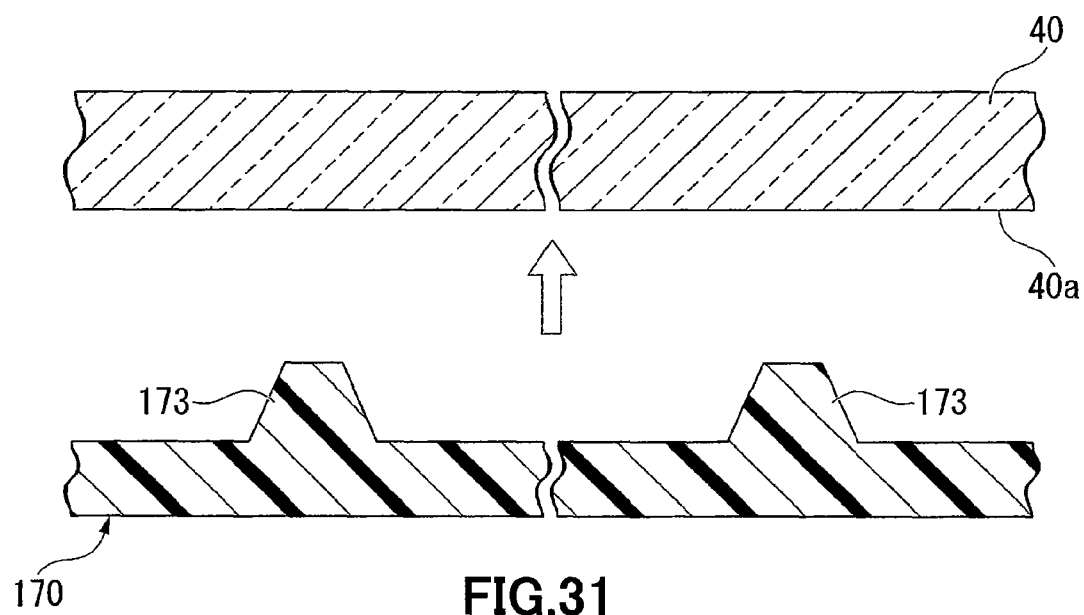
FIG. 31 is a view showing one step of a modified manufacturing process of the piezoelectric vibrator in accordance with the flowchart shown in FIG. 9, showing a mold member for forming a recess portion for a through-hole in the base board wafer and the base board wafer.
Figure 32:
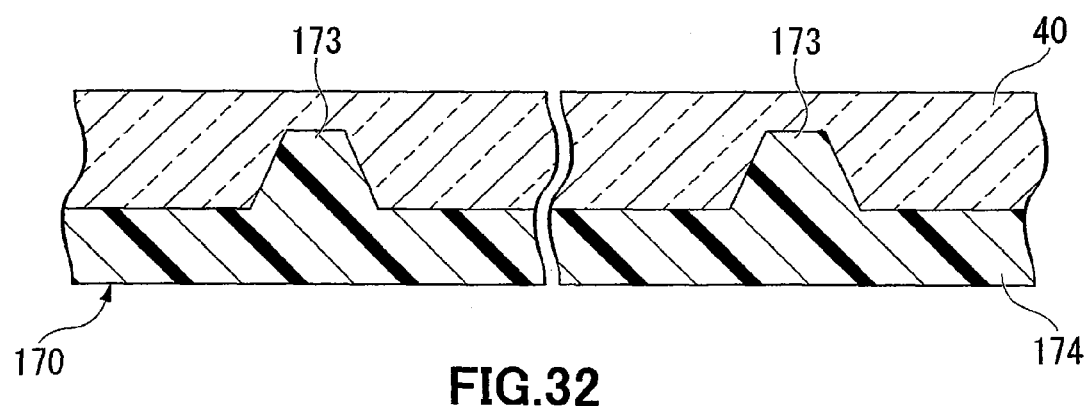
FIG. 32 is a view showing one step of a modified manufacturing process of the piezoelectric vibrator in accordance with the flowchart shown in FIG. 9, showing a state where the base board wafer and the mold member are in contact with each other.

As shown in FIGS. 31 and 32, a mold member 170 formed with protrusion portions 173 having approximately the same shape as the through-holes 30 and 31 is brought into contact with one surface 40a of the base board wafer 40 while heating the base board wafer 40. At that time, the protrusion portions 173 are stuck into the base board wafer 40. The mold member 170 includes a board portion 174 having approximately the same outer shape as the base board wafer 40 and the protrusion portions 173 protruding from the board portion 174.

Figure 33:
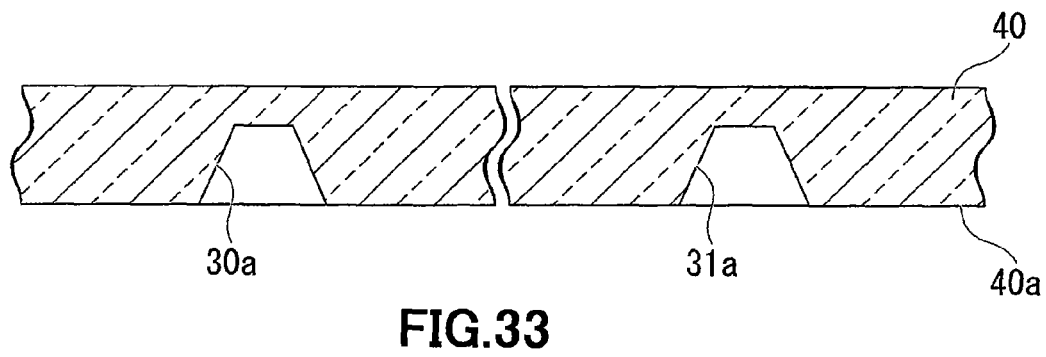
FIG. 33 is a view showing one step of a modified manufacturing process of the piezoelectric vibrator in accordance with the flowchart shown in FIG. 9, showing a state of the base board wafer when the base board wafer and the mold member are separated from each other.

After that, by separating the mold member 170 from the base board wafer 40 after cooling the base board wafer 40, as shown in FIG. 33, the recess portions 30a and 31a having approximately the same shape as the protrusion portions 173 are formed on the one surface 40a of the base board wafer 40.

Figure 34:
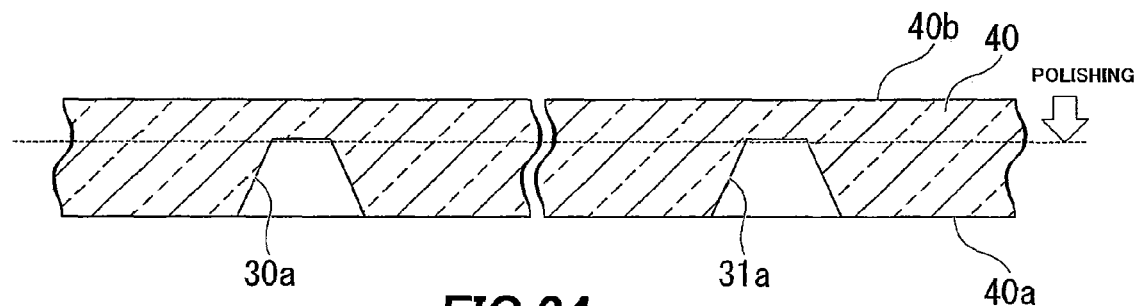
FIG. 34 is a view showing one step of a modified manufacturing process of the piezoelectric vibrator in accordance with the flowchart shown in FIG. 9, showing a state where the recess portion formed on the base board wafer is polished in order to form the through-hole.

Subsequently, a penetration hole forming step is performed where a plurality of pairs of through-holes 30 and 31 is formed so as to penetrate through the base board wafer 40. When the through-holes 30 and 31 are formed on the base board wafer 40, as shown in FIG. 34, the other surface 40b of the base board wafer 40 is polished.

Figure 35:
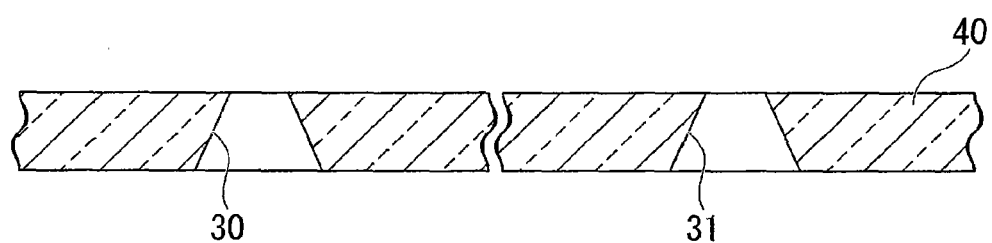
FIG. 35 is a sectional view showing one step of a modified manufacturing process of the piezoelectric vibrator in accordance with the flowchart shown in FIG. 9, showing the through-hole formed on the base board wafer.

As shown in FIG. 35, on the base board wafer 40, the through-holes 30 and 31 corresponding to the protrusion portions 173 of the mold member 170 are formed. One through-hole 30 is formed to be positioned close to the base portion 12 of the piezoelectric vibrating reed 4, and the other through-hole 31 is formed to be positioned close to the tip ends of the vibrating arms 10 and 11.

Subsequently, a penetration electrode alignment step is performed where the core portions 7 of the rivet members 9 are disposed in the plurality of through-holes 30 and 31, and a paste-like glass frit 6a made of a glass material is filled into the through-holes 30 and 31.

Figure 36:
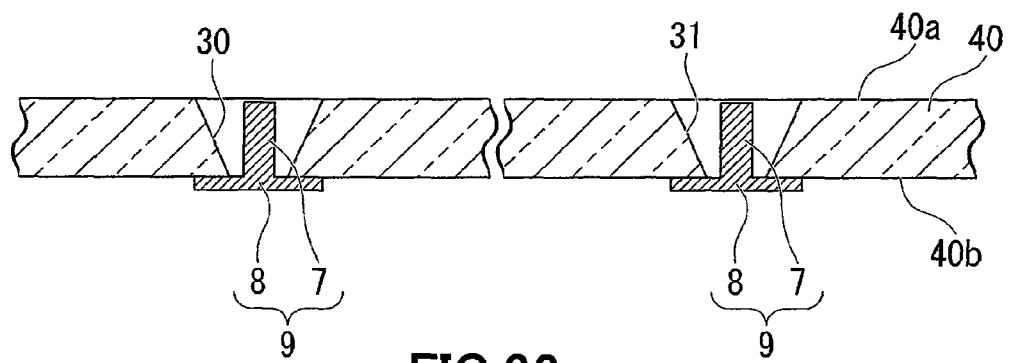
FIG. 36 is a view showing one step of a modified manufacturing process of the piezoelectric vibrator in accordance with the flowchart shown in FIG. 9, showing a state where the rivet member is disposed in the through-hole.
Figure 37:
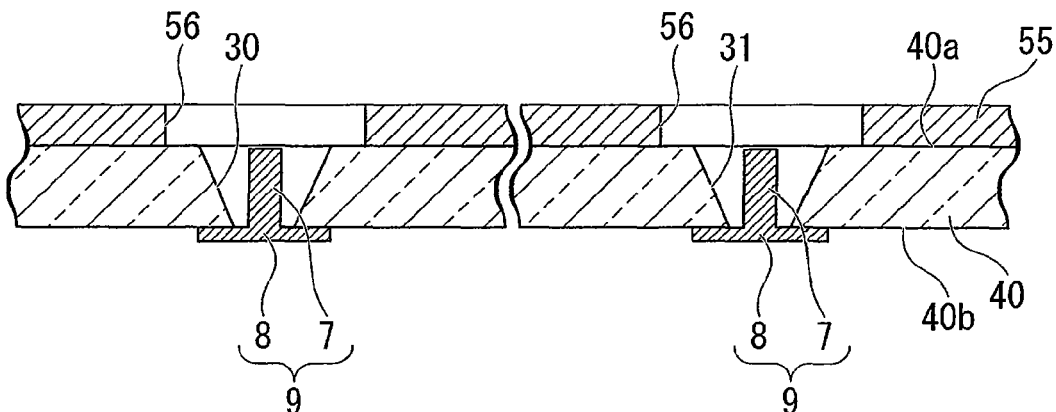
FIG. 37 is a view showing one step of a modified manufacturing process of the piezoelectric vibrator in accordance with the flowchart shown in FIG. 9, showing a state where a mask member is disposed in the base board wafer.

Specifically, as shown in FIG. 36, the core portion 7 is inserted until the base portion 8 of the rivet member 9 comes into contact with the base board wafer 40. Here, it is necessary to dispose the rivet member 9 so that the axial direction of the core portion 7 is approximately identical to the axial direction of the through-holes 30 and 31. However, since the rivet member 9 having the core portion 7 formed on the base portion 8 is used, it is possible to make the axial direction of the core portion 7 identical to the axial direction of the through-holes 30 and 31 by a simple operation of pushing the rivet member 9 until the base portion 8 comes into contact with the base board wafer 40. Therefore, it is possible to improve the workability during the penetration electrode alignment step.

In addition, by bringing the base portion 8 into contact with the surface of the base board wafer 40, it is possible to securely fill the paste-like glass frit 6a into the through-holes 30 and 31.

Since the base portion 8 has a planar shape, the base board wafer 40 can be placed stably on a flat surface of a desk or the like without any rattling during periods between the penetration electrode alignment step and a baking step performed later. In this respect, it is possible to achieve an improvement in the workability.

Here, the mask member 55 is disposed on a surface (the one surface 40a) of the base board wafer 40 where the base portions 8 of the rivet members 9 are not disposed. At positions of the mask member 55 corresponding to the through-holes 30 and 31, glass frit filling portions 56 are formed. The glass frit filling portions 56 are formed by penetration holes formed on the mask member 55, and the glass frit filling portions 56 have a larger diameter than the diameter of each of the through-holes 30 and 31. The mask member 55 is formed of a board member made of stainless steel, for example.

Figure 38:
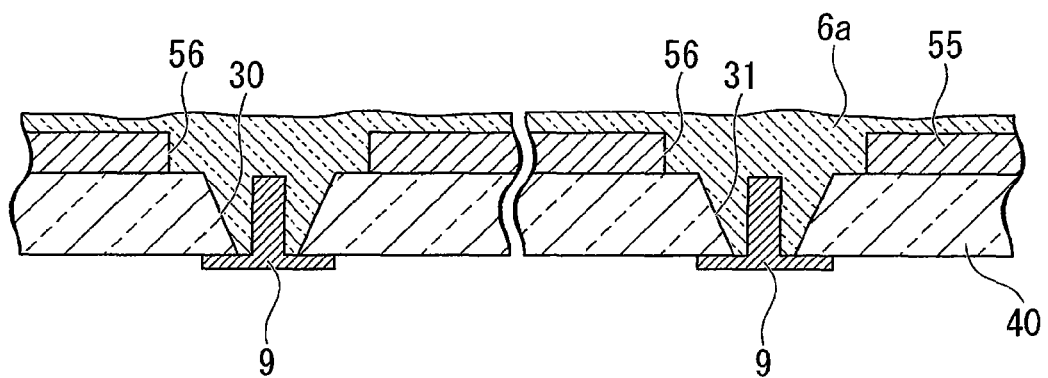
FIG. 38 is a view showing one step of a modified manufacturing process of the piezoelectric vibrator in accordance with the flowchart shown in FIG. 9, showing a state where a glass frit is filled in the through-hole and a glass frit filling portion of the mask member.
Figure 39:
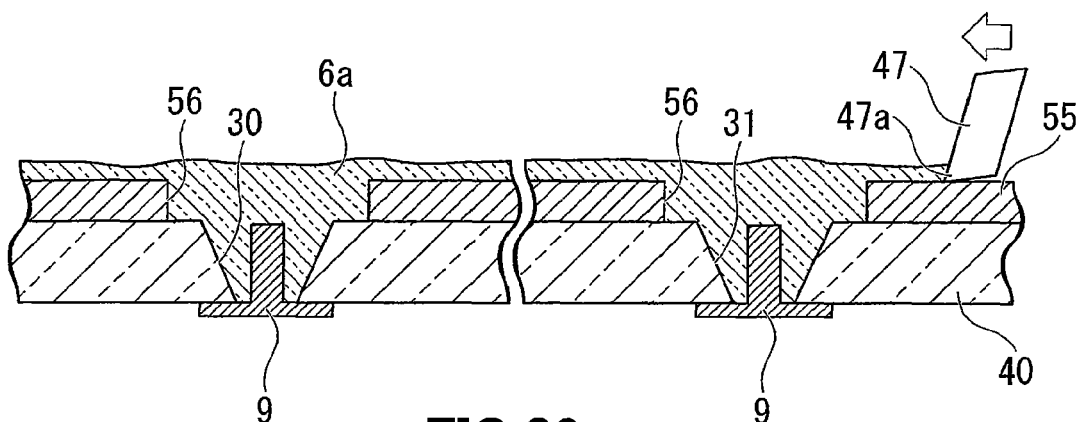
FIG. 39 is a view showing one step of a modified manufacturing process of the piezoelectric vibrator in accordance with the flowchart shown in FIG. 9, showing a state where a redundant glass frit is being removed.

Moreover, as shown in FIG. 38, when the glass frit 6a is filled into the through-holes 30 and 31 and the glass frit filling portions 56, a sufficient amount of the glass frit 6a is applied so that the glass frit 6a is securely filled therein. Therefore, the glass frit 6a is also applied onto the surface of the mask member 55. When the glass frit 6a is baked in this state, since it is difficult to remove the mask member 55 later, a glass frit removing step is performed to remove the redundant glass frit 6a before the baking. As shown in FIG. 39, in the glass frit removing step, the glass frit 6a is removed by moving a resin-made squeegee 47, for example, along the surface of the mask member 55 with a tip end 47a of the squeegee 47 coming into contact with the surface of the mask member 55.

Figure 40:
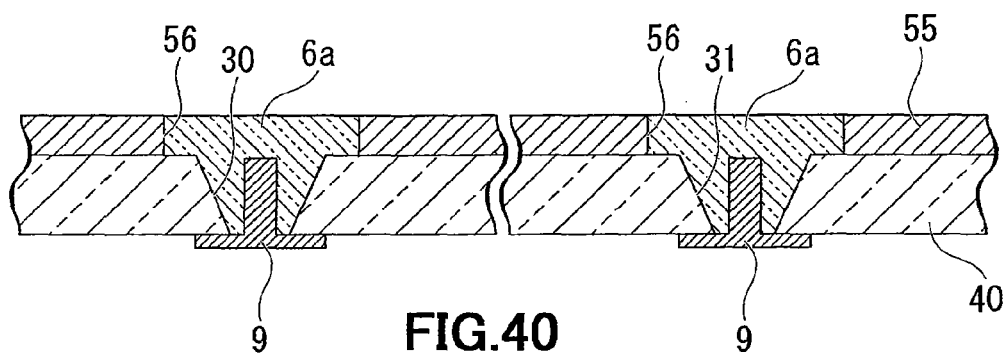
FIG. 40 is a view showing one step of a modified manufacturing process of the piezoelectric vibrator in accordance with the flowchart shown in FIG. 9, showing a state where the redundant glass frit was removed.

By doing so, as shown in FIG. 40, the redundant glass frit 6a can be removed securely by a simple operation. Here, in the present embodiment, since the glass frit 6a is filled in the glass frit filling portions 56 in addition to the through-holes 30 and 31, it is possible to increase the amount of the glass frit 6a filled for each through-hole.

Figure 41:
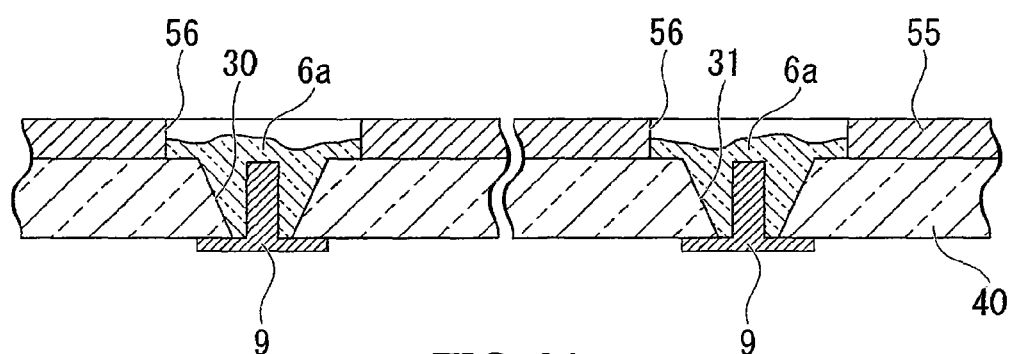
FIG. 41 is a view showing one step of a modified manufacturing process of the piezoelectric vibrator in accordance with the flowchart shown in FIG. 9, showing a state where the glass frit was baked, subsequent to the state shown in FIG. 40.

Subsequently, a baking step is performed where the buried filling material is baked at a predetermined temperature. In the baking step, the glass frit 6a filled in the through-holes 30 and 31 and the glass frit filling portions 56 is dried and sintered. At that time, as shown in FIG. 41, when the glass frit 6a is dried, the solvent in the glass frit 6a will be evaporated. When the glass frit 6a is sintered, the resin in the glass frit 6a will be evaporated. Thus, the volume of the glass frit 6a will decrease.

However, in the present embodiment, the glass frit filling portions 56 are formed at positions of the mask member 55 corresponding to the through-holes 30 and 31, so that the amount of the glass frit 6a filled in each of the through-holes 30 and 31 is increased. Therefore, even when the volume of the glass frit 6a decreases, the glass frit 6a will be baked in the state of being filled in the through-holes 30 and 31. That is, in the present embodiment, it is possible to decrease the number of times of the steps of filling and baking the glass frit 6a in the through-holes.

By the baking step, the through-holes 30 and 31, the glass frit 6a buried in the through-holes 30 and 31, and the rivet members 9 disposed in the glass frit 6a are attached to each other. Since the baking is performed for each base portion 8, the through-holes 30 and 31 and the rivet members 9 can be integrally fixed to each other in a state where the axial direction of the core portion 7 is approximately identical to the axial direction of the through-holes 30 and 31. The baked glass frit 6a is solidified as the cylindrical member 6.

Figure 42:
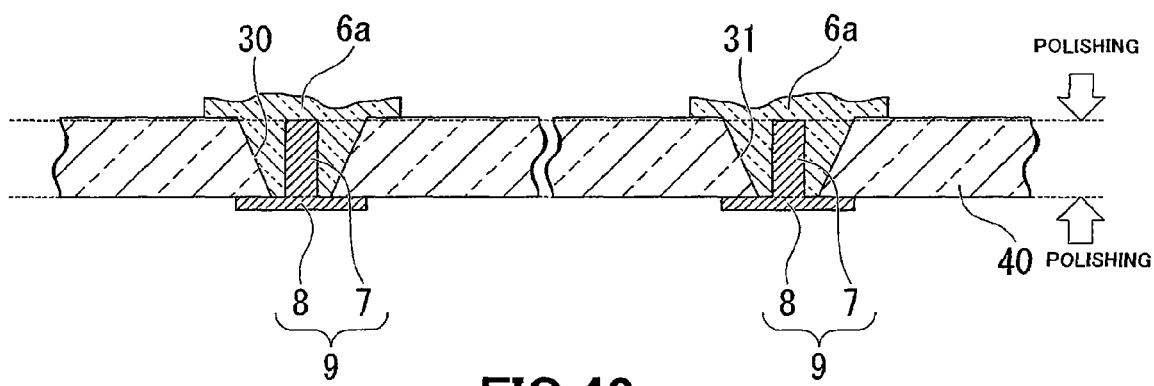
FIG. 42 is a view showing one step of a modified manufacturing process of the piezoelectric vibrator in accordance with the flowchart shown in FIG. 9, showing a state where a base portion of the rivet member and the base board wafer are being polished, subsequent to the state shown in FIG. 41.

Subsequently, as shown in FIG. 42, after the baking step, a polishing step is performed where the mask member 55 is separated, and both surfaces of the base board wafer 40 are polished so as to remove the base portions 8 of the rivet members 9 and the redundant glass frit 6a. In this way, it is possible to remove the base portions 8 that achieved positioning of the cylindrical member 6 and the core portions 7 and allow only the core portions 7 to remain inside the cylindrical member 6.

Both surfaces of the base board wafer 40 are polished until both ends of the core portion 7 are exposed. As a result, as shown in FIG. 24, it is possible to obtain a plurality of pairs of penetration electrodes 32 and 33 in which the cylindrical member 6 and the core portion 7 are integrally fixed.

According to this modification of the package manufacturing method, by forming penetration holes having a larger diameter than the through-holes 30 and 31 of the base board wafer 40 on the mask member 55 which is used during the step of filling the glass frit 6a, it is possible to use the large-diameter penetration holes as the glass frit filling portions 56. That is, it is possible to improve the production efficiency of the piezoelectric vibrator 1 with a simple configuration.

The invention claimed is:

1. A method for producing piezoelectric vibrators, comprising:
    (a) defining a plurality of first substrates on a first wafer and a plurality of second substrates on a second wafer;
    (b) forming at least one through hole in respective at least some of the first substrates, wherein a respective the at least one through hole comprises an electrode hole and an excess filler hole which is continuous from the electrode hole and open in a first surface of the first wafer;
    (c) providing filler paste in the electrode hole and the excess filler hole of a respective at least some of the through holes;

(d) firing the first wafer to harden the filler paste in the at least some of the through holes;
(e) removing the first surface of the first wafer to reduce a thickness of the first wafer to substantially eliminate the excess filler holes from the first wafer and expose the hardened filler paste at the first surface of the first wafer;
(f) layering the first and second wafers such that at least some of the first substrates substantially coincide respectively with at least some of the corresponding second substrates, wherein a piezoelectric vibrating strip is secured in a respective at least some of the coinciding first and second substrate pairs; and
(g) hermetically bonding at least some of the coinciding first and second substrate pairs.

2. The method according to claim 1, further comprising cutting off respective at least some of the hermetically bonded pairs from the first and second wafers.

3. The method according to claim 1, wherein forming the at least one through hole in respective at least some of the first substrates comprises pressing projections into the first surface of the first wafer to form at least one press-formed hole in the respective at least some of the first substrates.

4. The method according to claim 3, wherein the forming at least one through hole in respective at least some of the first substrates comprises pressing the projections into the first surface of the first wafer to form at least one non-penetrating, press-formed hole in the respective at least some of the first substrates and removing a second surface of the first wafer to open the press-formed holes through the first wafer.

5. The method according to claim 3, wherein the excess filler hole is larger in cross-section than, and contiguous via a step to from, the electrode hole.

6. The method according to claim 3, wherein the through hole becomes larger in cross-section from the second surface of the first wafer towards the first surface surface thereof.

7. The method according to claim 1, wherein providing the filler paste in the electrode hole and the excess filler hole of a respective at least some of the through holes comprises placing a conductive pillar in a respective at least some of the electrode holes before providing the filler paste, the conductive pillar having a length nearly equal to a depth of the electrode hole.

8. The method according to claim 7, wherein the conductive pillar is supported by a flange at a center of the electrode hole.

9. The method according to claim 1, wherein providing filler paste in the electrode hole the excess filler hole of a respective at least some of the through holes comprises providing the filler paste more than enough to fill the electrode hole and the excess filler hole, and removing excess filler paste thereafter.

10. A method for producing piezoelectric vibrators, comprising:
(a) defining a plurality of first substrates on a first wafer and a plurality of second substrates on a second wafer;
(b) forming at least one through hole in respective at least some of the first substrates, wherein a respective the at least one through hole comprises an electrode hole open in a first surface of the first wafer;
(c) placing a mask on the first surface of the first wafer which has a plurality of holes substantially aligned, respectively, with the at least some of the through holes formed in the first wafer, wherein the holes of the mask form excess filler holes continuous from the aligned at least some of the electrode holes;
(d) providing filler paste in at least some of the aligned sets of the electrode holes and the excess filler holes;
(e) firing the first wafer with the mask placed thereon to harden the filler paste in the at least some of the aligned sets of the electrode holes and the excess filler holes;
(f) removing the mask from the first surface of the first wafer and removing excess filler paste left on the first surface of the first wafer;
(g) layering the first and second wafers such that at least some of the first substrates substantially coincide respectively with at least some of the corresponding second substrates, wherein a piezoelectric vibrating strip is secured in a respective at least some of the coinciding first and second substrate pairs; and
(h) hermetically bonding at least some of the coinciding first and second substrate pairs.

* * * * *

UNITED STATES PATENT AND TRADEMARK OFFICE
CERTIFICATE OF CORRECTION

PATENT NO. : 8,281,468 B2
APPLICATION NO. : 12/868301
DATED : October 9, 2012
INVENTOR(S) : Yoichi Funabiki et al.

Page 1 of 1

It is certified that error appears in the above-identified patent and that said Letters Patent is hereby corrected as shown below:

In the Claims

In column 23, claim 5, line 32, before "from, the" delete "to".

In column 24, claim 9, line 5, after "the electrode hole" insert --and--.

Signed and Sealed this
Twelfth Day of March, 2013

Teresa Stanek Rea
*Acting Director of the United States Patent and Trademark Office*